US011029381B2

(12) United States Patent
Park et al.

(10) Patent No.: US 11,029,381 B2
(45) Date of Patent: Jun. 8, 2021

(54) METHOD FOR VARYING UNDERSAMPLING DIMENSION FOR ACCELERATING MULTIPLE-ACQUISITION MAGNETIC RESONANCE IMAGING AND DEVICE FOR THE SAME

(71) Applicant: KOREA ADVANCED INSTITUTE OF SCIENCE AND TECHNOLOGY, Daejeon (KR)

(72) Inventors: Sung-Hong Park, Daejeon (KR); Ki-Hwan Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 185 days.

(21) Appl. No.: 16/246,598

(22) Filed: Jan. 14, 2019

(65) Prior Publication Data

US 2019/0219654 A1    Jul. 18, 2019

(30) Foreign Application Priority Data

Jan. 12, 2018 (KR) .......... 10-2018-0004671
Jan. 10, 2019 (KR) .......... 10-2019-0003238

(51) Int. Cl.
*G01R 33/561* (2006.01)
*G06N 20/00* (2019.01)
*G01R 33/565* (2006.01)
*G06N 3/08* (2006.01)
*G01R 33/48* (2006.01)
*G01R 33/56* (2006.01)
*G06N 3/04* (2006.01)

(52) U.S. Cl.
CPC ....... *G01R 33/5614* (2013.01); *G01R 33/482* (2013.01); *G01R 33/5608* (2013.01); *G01R 33/5611* (2013.01); *G01R 33/5619* (2013.01); *G01R 33/56545* (2013.01); *G01R 33/56554* (2013.01); *G06N 3/0454* (2013.01); *G06N 3/08* (2013.01); *G06N 20/00* (2019.01)

(58) Field of Classification Search
CPC .......... G01R 33/5614; G01R 33/5611; G01R 33/482; G01R 33/5608; G01R 33/5619; G01R 33/56545; G01R 33/56554; G06N 3/0454; G06N 20/00; G06N 3/08
USPC .................................. 324/307, 309
See application file for complete search history.

(56) References Cited

U.S. PATENT DOCUMENTS

2017/0184694 A1* 6/2017 Li .......... G01R 33/565

* cited by examiner

Primary Examiner — Farhana A Hoque
(74) Attorney, Agent, or Firm — Mayer & Williams, PC; Stuart Mayer

(57) ABSTRACT

Provided is an MRI image generation method including: acquiring first phase encoding lines obtained by undersampling along a first direction using an MRI device; acquiring second phase encoding lines obtained by undersampling in a second direction different from the first direction using the MRI device; generating a first MRI image based on the first phase encoding lines and the second phase encoding lines; and generating a second MRI image different from the first MRI image based on the first phase encoding lines and the second phase encoding lines.

9 Claims, 19 Drawing Sheets

Multi-contrast MRI

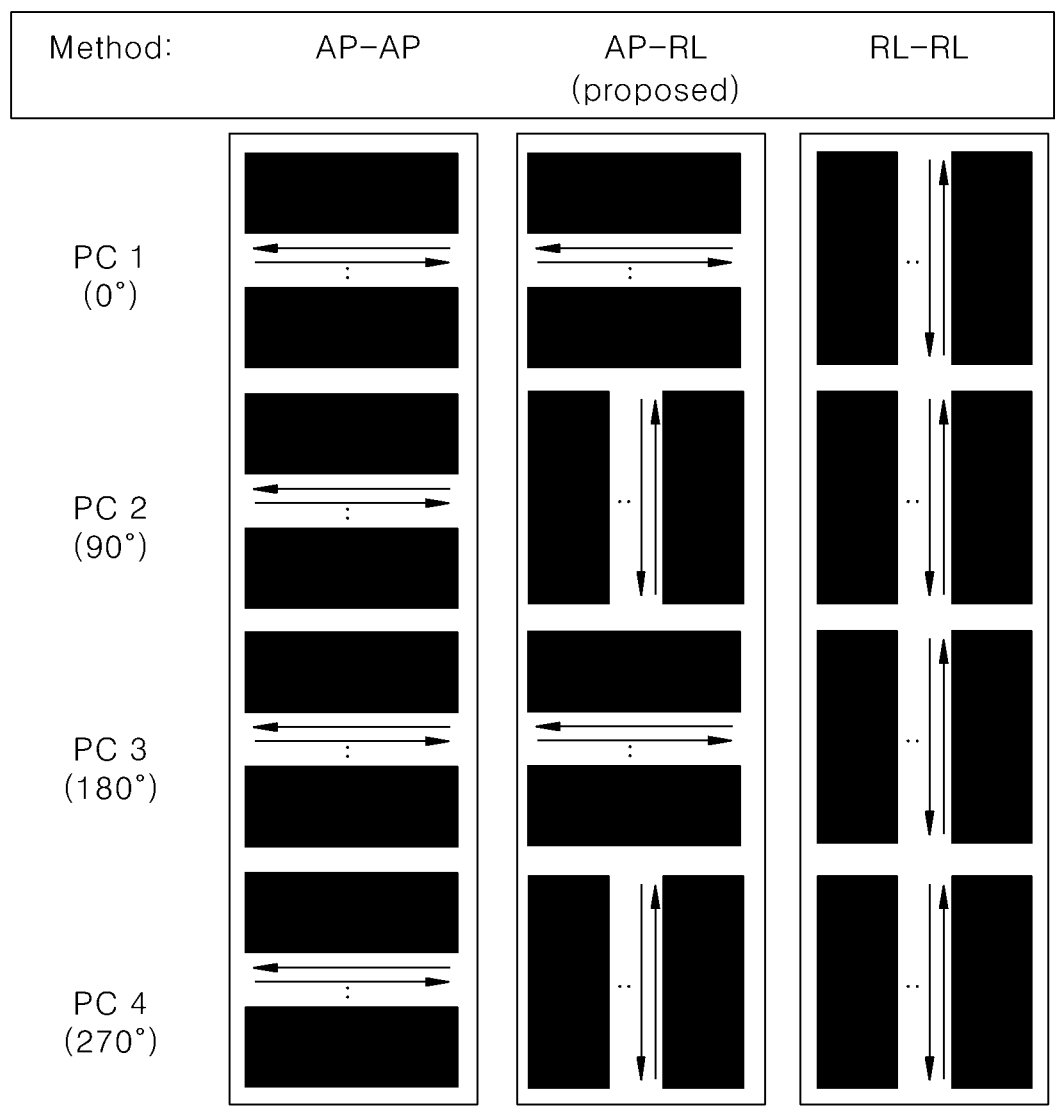

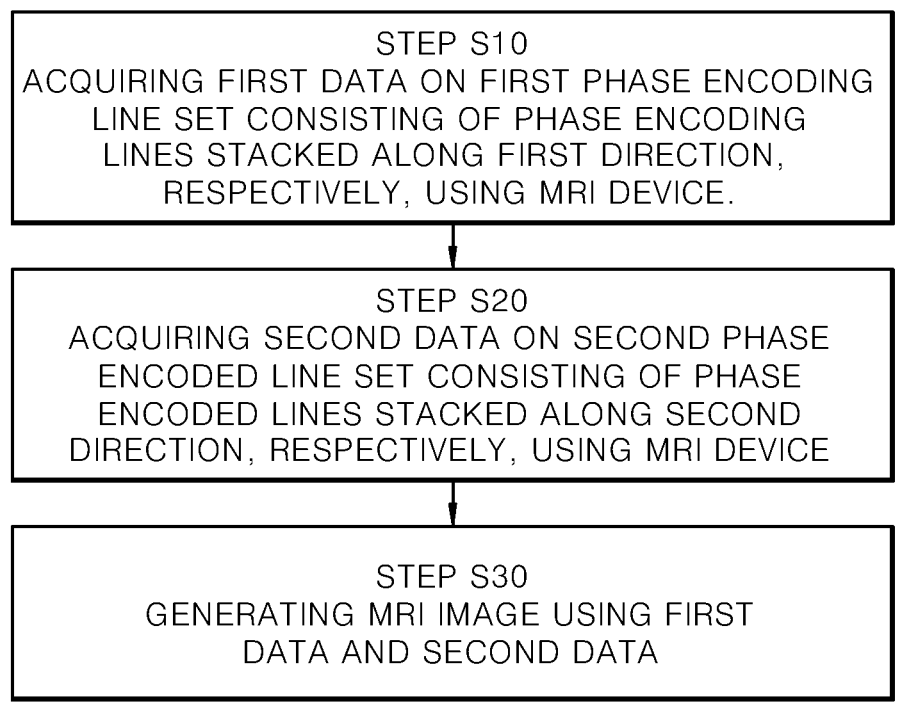

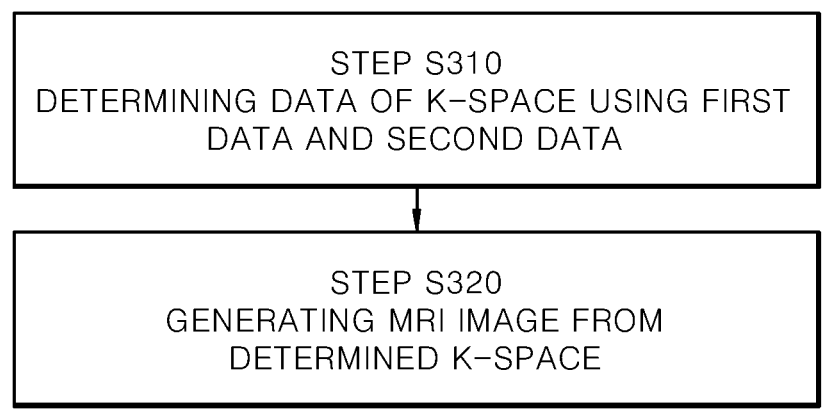

FIG. 10

| Sampling pattern | Sampling strategy | Public data ||||||||| in vivo data ||||
|---|---|---|---|---|---|---|---|---|---|---|---|---|---|
| | | Accelerating factor 4 |||| Accelerating factor 8 |||| Accelerating factor 4 ||||
| | | Proposed || Undersampled || Proposed || Undersampled || Transfer learning || Undersampled ||
| | | NRMSE | SSIM | NRMSE | SSIM | NRMSE | SSIM | NRMSE | SSIM | NRMSE | SSIM | NRMSE | SSIM |
| Central | AP-AP | 0.079 | 0.95 | 0.119 | 0.88 | 0.121 | 0.89 | 0.200 | 0.72 | 0.090 | 0.91 | 0.106 | 0.87 |
| | AP-RL | 0.053 | 0.97 | 0.119 | 0.88 | 0.089 | 0.93 | 0.200 | 0.72 | 0.072 | 0.92 | 0.106 | 0.87 |
| | RL-RL | 0.068 | 0.96 | 0.105 | 0.91 | 0.110 | 0.91 | 0.187 | 0.76 | 0.089 | 0.91 | 0.103 | 0.88 |
| | AP_alone | 0.086 | 0.94 | 0.119 | 0.88 | 0.132 | 0.86 | 0.200 | 0.72 | 0.092 | 0.90 | 0.106 | 0.87 |
| | AP_alone | 0.074 | 0.95 | 0.105 | 0.91 | 0.122 | 0.89 | 0.187 | 0.76 | 0.090 | 0.91 | 0.103 | 0.88 |
| Random | AP-AP | 0.085 | 0.93 | 0.188 | 0.67 | 0.119 | 0.88 | 0.224 | 0.61 | 0.099 | 0.87 | 0.189 | 0.72 |
| | AP-RL | 0.065 | 0.95 | 0.188 | 0.67 | 0.087 | 0.92 | 0.224 | 0.61 | 0.086 | 0.90 | 0.189 | 0.72 |
| | RL-RL | 0.078 | 0.94 | 0.179 | 0.72 | 0.109 | 0.90 | 0.215 | 0.66 | 0.104 | 0.89 | 0.191 | 0.75 |
| | AP_alone | 0.091 | 0.91 | 0.188 | 0.67 | 0.128 | 0.86 | 0.224 | 0.61 | 0.101 | 0.87 | 0.189 | 0.72 |
| | AP_alone | 0.085 | 0.92 | 0.179 | 0.72 | 0.118 | 0.88 | 0.215 | 0.66 | 0.108 | 0.87 | 0.191 | 0.75 |

FIG. 12

| Sampling strategy | CNNs | FMC-CS | BCS | Undersampled |
|---|---|---|---|---|
| 1_1 | 0.112 | 0.118 | 0.140 | 0.214 |
| 1_2 | 0.101 | 0.115 | 0.136 | 0.214 |
| 2_2 | 0.113 | 0.138 | 0.157 | 0.218 |

FIG. 13

| Sampling pattern | Sampling strategy | CNN | | Undersampled | |
|---|---|---|---|---|---|
| | | NRMSE | SSIM | NRMSE | SSIM |
| Central | AP-AP | 0.28 | 0.80 | 0.38 | 0.64 |
| | AP-RL | 0.20 | 0.84 | 0.27 | 0.72 |
| | RL-RL | 0.22 | 0.82 | 0.25 | 0.73 |
| Random | AP-AP | 0.29 | 0.76 | 0.38 | 0.58 |
| | AP-RL | 0.22 | 0.81 | 0.32 | 0.60 |
| | RL-RL | 0.23 | 0.79 | 0.32 | 0.62 |

METHOD FOR VARYING UNDERSAMPLING DIMENSION FOR ACCELERATING MULTIPLE-ACQUISITION MAGNETIC RESONANCE IMAGING AND DEVICE FOR THE SAME

CROSS-REFERENCE TO RELATED APPLICATIONS

This U.S. non-provisional patent application claims priority under 35 U.S.C. § 119 of Korean Patent Application No. 10-2018-0004671, filed on Jan. 12, 2018, and Korean Patent Application No. 10-2019-0003238, filed on Jan. 10, 2019, the entire contents of which are hereby incorporated by reference.

BACKGROUND

The present invention relates to an MRI scanner and a computing device, and more particularly, to a technique for speeding up multi-image acquisition using MRI.

Background art for understanding the present invention are disclosed in various publications including Korea Patent Application No. 10-2015-0119256 and Korean Patent Application No. 10-2015-0119257.

Korean Patent Application No. 10-2015-0119256 discloses a technical concept regarding Balanced Steady-State Free Precession (bSSFP), contrast enhancement of MRI images, phase encoding (PE), a PE gradient magnetic field, PE orders such as centric PE order (=central PE order, =central sampling pattern)/pairing PE order (=pairing sampling pattern)/dAVE PE order (=dAVE sampling pattern), k-space, a phase encoding (PE) line, and the like.

Korean Patent Application No. 10-2015-0119257 also discloses technical concepts and examples regarding the configuration of fast magnetic resonance imaging and k-space.

The contents of Korean Patent Application No. 10-2015-0119256 and Korean Patent Application No. 10-2015-0119257 are incorporated herein by reference for the understanding of the present invention.

In MRI physics, k-space is the 2D or 3D Fourier transform of the measured MR image. The complex number value is sampled during the MR measurement through a pre-planned scheme controlled by a pulse sequence, i.e., the radio frequency of the accurate timing and the sequence of the gradient pulses. Actually, the k-space often refers to a temporary image space, typically a matrix, in which data of the digitized MR signal is stored during data acquisition. When the scan is completed and the k-space is full, the data is mathematically processed so that the final image is generated. Therefore, the k-space retains raw data before reconstruction.

In the case of actual images, the k-space is conjugate symmetric. The imaginary components of k-space coordinates opposite to each other have opposite signs.

Generally, the k-space has the final image and the same number of rows and columns and is filled with raw-data during the scan. Generally, information of one line is filled per one Repetition Time (TR).

The MR image is a complex map of the spatial distribution of the transverse magnetization $M_{xy}$ in the sample at a specific time point after excitation. The low spatial frequency (near the center of the k-space) includes the signal for the noise and contrast information of the image, but the high spatial frequency (the outer circumference area of the k-space) determines the image resolution. This is the basis of the scanning technique where the first complete k-space is acquired and subsequent scans only acquire the central part of the k-space. In this way, different contrast images may be acquired without having to perform a full scan.

Image magnetization $M_{xy}$ is prepared to be simply proportional to the contrast-weighted proton density, and thus, if it is a real number, good symmetry exists in the k-space. There is some redundancy in the k-space information, and the image may be reconstructed using only half the k-space in the Phase Encode (PE) direction storage scanning time (this technique is known as half Fourier or half scan). Or, in the Frequency Encode (FE) direction, a lower sampling frequency and/or a shorter echo time (this technique is known as half echo) is allowed. However, these techniques correspond to approximation values due to phase errors of MRI data that are not fully controllable, or due to a non-zero phase by physical problems.

Routine MRI protocols often consist of multiple data acquisitions for a single anatomical structure. For example, multiple images are independently acquired using multiple MRI sequences for the same field of view, to obtain a variety of tissue contrasts for more accurate diagnosis. Multiple acquisitions are required to measure dynamic physiology in dynamic susceptibility contrast (DSC)-MRI and to improve signal-to-noise ratio (SNR) in arterial spin labeling (ASL). Relaxometry and subtraction-based MR angiography also require multiple acquisitions. Another example is that imaging with balanced steady-state free precession (bSSFP) sequence is sometimes repeated with multiple phase cycling (PC), in order to suppress banding artifacts. Since banding artifacts in bSSFP can be modulated by handling the phase of radiofrequency (RF) pulse, many studies have proposed methods based on multiple PC-bSSFP acquisitions for banding artifact suppression. As such, MR imaging often requires imaging multiple times on the same anatomy, which we call multi-acquisition MRI hereafter.

Since multi-acquisition MRI requires a long scan time, acceleration of MRI scan is a well-motivated problem. Compressed sensing (CS) algorithms have been introduced to solve this problem. CS has been successfully applied to dynamic MR imaging with undersampling along the spatial and temporal dimensions. Since the data redundancy increases along the temporal dimension, the reconstruction performance can be improved more efficiently.

In addition, CS algorithms to jointly reconstruct two or more images have been proposed. These CS algorithms demonstrated that reconstruction could be improved by incorporating structural information of images with different contrasts. A similar approach has also been applied to accelerate multiple PC-bSSFP.

Recently, Convolutional neural networks (CNNs) have been applied to accelerate MRI scan. Aliasing artifacts by incoherent sampling can be suppressed by CNNs, and the images acquired with CNNs had smaller errors than those with CS algorithms in some cases of single image reconstruction). In addition, the feasibility of CNNs to share anatomical information from other images acquired with different pulse sequences was demonstrated in previous works. By sharing information between images acquired with the same or different pulse sequences, CNN can improve the reconstruction of multi-acquisition MRI.

In multi-acquisition MRI, the acceleration of data acquisition can be enhanced by a sampling strategy that can effectively share information between the multiple images. In general, the sampling pattern has been extensively studied in CS algorithms, as it is an important factor affecting the reconstruction performance. For example, to optimize the incoherency of the sampling pattern, a probability density function (PDF) has been proposed, taking into account the difference in amplitude between high and low frequencies for each k-space. The sampling pattern is also important for multi-acquisition MRI. In recent studies for multiple PC-bSSFP, low-correlation sampling strategies have been proposed and demonstrated improved performance. Since structural information is constant regardless of PC, repetitive sampling of the same high frequency contents can be redundant. The acceleration of multiple PC-bSSFP could be improved by reducing the correlation between the sampling patterns of multiple PC datasets in heuristic or automatic manners. In contrast to the importance of the issue, little study has been performed on the sampling strategy for accelerating multi-acquisition MRI.

Although reconstruction of multiple contrast images simultaneously has been considered one efficient method to accelerate MR imaging, the concept of varying undersampling pattern between the images has not been explored. For example, several CS algorithms, a deep learning method, and a deep learning method combined with CS and parallel imaging have been developed to jointly reconstruct multi-contrast MR images, but the sampling pattern between different images have been the same. As another example, several methods have been introduced to jointly reconstruct multiple PC-bSSFP imaging, where the sampling pattern remained the same across the multiple PC bSSFP images.

SUMMARY

The present invention proposes a new sampling strategy that reduces the redundancy of k-space for multiple acquisitions in a simple and effective manner.

The object of the present invention is to propose a new strategy that may be applied to the acceleration of multiple acquisition MRI.

Common MR protocols generally consist of multiple scans for various contrasts. The repeated acquisition and reconstruction processes of multiple contrast images with the same scan direction may be accelerated by exchanging information between images.

The present invention proposes a sampling strategy for efficiently accelerating the multi-acquisition MRI.

The sampling strategy proposed by the present invention was designated to improve the efficiency of multi-acquisition MRI by alternatively changing PE direction. Even though two images obtained from different sequences have different tissue contrasts, undersampling with different PE direction could improve reconstruction performance for both of them. Since undersampling lowers resolution or causes aliasing artifacts in certain directions, integrating images undersampled along different PE directions can play a complementary role for each other.

In the present invention, a data acquisition scheme referred to by the term "undersampling" may refer to a data acquisition scheme that does not acquire a portion of the total K-space data that must be acquired to achieve a predetermined FOV and resolution.

Sampling Strategy

According to one aspect of the present invention, a new sampling strategy for multi-acquisition can be provided to acquire data with different phase encoding (PE) direction across multiple images. Undersampling of multiple images with different PE direction reduces the overlap of the sampled k-space data between images in a simple way, and this method can be combined with any sampling pattern.

FIG. 1 illustrates a sampling strategy for multiple acquisition MRI.

FIG. 1A shows a pattern sampled in a phase encoding direction, and two sampling patterns (central and random) are used along two PE directions indicated by directions 1 and 2. That is, FIG. 1A illustrates an acquisition method for k-space data using a central sampling pattern and a random sampling pattern.

In FIG. 1A, four k-space data are illustrated. The white part indicates a k-space area where data is acquired according to the repetition of the TR, and the black part indicates a k-space area where data is not acquired. In each k-space, the horizontal axis represents the axis in the kx direction, and the vertical axis represents the axis in the ky direction.

The first column of FIG. 1A represents the central sampling pattern and the second column represents the random sampling pattern.

The first row of FIG. 1A shows the case where the phase encoding direction is the ky direction, and the second row shows the case where the phase encoding direction is the kx direction.

In the MRI data acquisition process following the phase encoding pattern according to the first row of FIG. 1A, first, one line of data along the horizontal direction kx on the drawing is acquired. Then, the data is acquired again along the horizontal direction kx (i.e., the frequency encoding direction) on the drawing, after moving one space in the vertical direction ky on the drawing, i.e., the phase encoding (PE) direction. Then, the process of moving one space in the vertical direction ky of the drawing is repeated. When shooting is made under the undersampling method, the number of times of movement in the phase encoding direction (ky direction) decreases, so that the entire shooting time is reduced.

Conversely, in the MRI data acquisition process according to the phase encoding pattern according to the second row of FIG. 1A, data is first acquired along the vertical direction ky on the drawing. Next, the data is acquired along the vertical direction ky on the drawing after moving one space in the horizontal direction kx of the drawing, i.e., the phase encoding (PE) direction. Then, the process of moving one space in the horizontal direction kx on the drawing is repeated. When shooting is made under the undersampling method, the number of times of movement in the phase encoding direction (kx direction) decreases, so that the entire shooting time is reduced.

For example, if the person is lying straight in the MRI device for MRI imaging, the direction indicated by the first straight line connecting the centers of the eyes of the person is defined as the horizontal direction kx, and the direction indicated by the second straight line extending in the horizontal direction perpendicular to the first straight line may be defined as the vertical direction ky. At this time, for example, in the MRI data acquisition process according to the phase encoding pattern according to the first row of FIG. 1A, the phase encoding direction may be the vertical direction ky, and in the MRI data acquisition process following the phase encoding pattern according to the second row of FIG. 1A, the phase encoding direction may be the horizontal direction kx.

In the drawings shown in the first row of FIG. 1A, each phase encoding line has a rectangular shape long in the horizontal direction kx. That is, in the drawing shown in the first row of FIG. 1A, each phase encoding line extends along the horizontal direction kx.

Conversely, in the drawings shown in the second row of FIG. 1A, each phase encoding line has a rectangular shape long in the vertical direction ky. That is, in the drawing shown in the second row of FIG. 1A, each phase encoding line extends along the vertical direction ky.

In the drawing shown in the first row of FIG. 1A, it may be considered that a plurality of phase encoding lines are stacked along the vertical direction ky.

Conversely, in the drawings shown in the second row of FIG. 1A, it may be considered that a plurality of phase encoding lines are stacked along the horizontal direction kx.

In the drawings shown in the first row of FIG. 1a, the phase encoding direction is the vertical direction ky and the frequency encoding direction is the horizontal direction kx.

Conversely, in the drawings shown in the second row of FIG. 1A, the phase encoding direction is the horizontal direction kx and the frequency encoding direction is the vertical direction ky.

In the four k-spaces shown in FIG. 1A, each image is undersampled.

First, according to one aspect of the present invention, the proposed sampling strategy with the central sampling pattern can be applied for reconstruction using CNNs. CNNs are trained to predict the difference between the full-sampled images and the undersampled images in the spatial domain, and thus they do not require an incoherent sampling pattern.

Second, according to another aspect of the present invention, the proposed strategy with the random sampling pattern can be applied for reconstruction using both CNNs and the CS algorithms.

In the present invention, the proposed central and random sampling strategies for CNNs and CS algorithms were evaluated in multi-contrast MRI and multiple PC-bSSFP.

Application to Multi-Contrast MRI

Since high frequency contents are less dependent on contrast, it would be helpful for image reconstruction if high frequency contents are incorporated from another contrast image. When two images with different contrast are acquired with the same sampling pattern, the sampled high frequency contents in the two images are similar.

FIG. 1B(a) shows several sampling strategies of multiple contrast MRIs, and three sampling strategies (AP-AP, AP-RL, and RL-RL) representing the same or different combinations of sampling patterns are generated. Also, as shown in FIG. 1B(b), the image is undersampled separately in two sampling patterns. Here, the 'AP' represents front and rear, and 'RL' represents right-left.

In FIG. 1B(a), six k-space samples are presented. The two k-space samples shown in the first column AP-AP are undersampled along the same PE direction (ky direction). The two k-space samples shown in the third column RL-RL are undersampled along the same PE direction (kx direction).

In comparison with this, when the two images are undersampled along different PE directions (e.g. AP-RL) according to the present invention, the overlapping portion between the two k-spaces is reduced. For example, when two k-spaces are 4-fold undersampled, only 6% of each k-space overlaps. Non-overlapping high frequency contents from one k-space can be exploited to reconstruct another k-space acquired with different contrast.

In addition, the proposed sampling strategy with different PE directions can be combined with any sampling pattern including the random sampling for reconstruction using CNNs and the CS algorithms. The two images randomly undersampled with different PE directions have aliasing artifacts in directions perpendicular to each other. Therefore, incorporating another image affected by aliasing artifacts in different direction may improve image reconstruction, even if the contrast of the two images is different.

FIG. 1B(b) shows an example of using only one undersampled image without a reference image to evaluate the effect of the reference image.

Application to Multiple PC-MRI

The proposed sampling strategy according to the present invention with different PE direction (AP-RL) can be used to obtain multiple PC-bSSFP images for banding artifact suppression.

FIG. 1C shows various sampling strategies for PC-bSSFP, and three sampling strategies (AP-AP, AP-RL, RL-RL) may be generated for four PC-bSSFPs (four rows).

A total of 12 k-space samples are shown in FIG. 1C. The first to fourth rows represent different parameters of 0 degree, 90 degree, 180 degree, and 270 degree, respectively. The four k-space samples shown in the first column AP-AP are undersampled along the same PE direction (ky direction). The four k-space samples shown in the third column RL-RL are undersampled along the same PE direction (kx direction).

Through a method proposed according to an aspect of the present invention, the four k-space samples shown in the second column of FIG. 1C may be undersampled along different PE directions, and an image may be reconstructed therefrom.

The location of the artifacts is changed by RF phase cycling, but the anatomical structure is constant. Therefore, image reconstruction can be improved by taking anatomical information from multiple images undersampled along different PE directions. In an experiment according to the present invention, we evaluated the three different sampling strategies by changing PE direction. Only the central sampling pattern is shown in FIG. 1C, but the random sampling is also applicable.

The sampling strategy proposed by the present invention can be applied to multiple PC-bSSFP imaging more naturally, because most of the information from the images is the same except for the presence of banding artifacts. A recent work proposed a sampling strategy to generate multiple sampling patterns for joint reconstruction of multiple PC-bSSFP imaging, but the performance of this method was demonstrated only in two phase-encoding dimension of 3D Cartesian acquisition. The method proposed in this study is simpler and was evaluated in both central and random sampling of 2D Cartesian acquisition. Furthermore, the proposed strategy was demonstrated in both CS and CNNs, which supports that our method can be generalized.

According to one aspect of the present invention, an MRI image generation method can be provided which comprises: acquiring first phase encoding lines obtained by undersampling along a first direction using an MRI device; acquiring second phase encoding lines obtained by undersampling in a second direction different from the first direction using the MRI device; generating a first MRI image based on the first phase encoding lines and the second phase encoding lines; and generating a second MRI image different from the first MRI image based on the first phase encoding lines and the second phase encoding lines.

The above generating of the first MRI image may comprises: determining a first k-space based on the first phase encoding lines and the second phase encoding lines; and generating the first MRI image from the first k-space, wherein the generating of the second MRI image comprises: determining a second k-space different from the first k-space based on the first phase encoding lines and the second phase encoding lines; and generating the second MRI image from the second k-space.

The above determining of the first k-space may comprise filling the first phase encoding lines into a k-space required to obtain a predetermined FOV and resolution, and filling a portion or all of a remaining portion of the k-space using the second phase encoding lines, wherein the determining of the second k-space comprises filling the first phase encoding lines into the k-space and filling a portion or all of the remaining portion of the k-space using the second phase encoding lines.

The above first phase encoding lines may be acquired using any one sampling pattern among a central sampling pattern and a random sampling pattern, wherein the second phase encoding lines are acquired using any one sampling pattern among a central sampling pattern and a random sampling pattern.

The above generating of the first MRI image may comprise providing first data on the first phase encoding lines and second data on the second phase encoding lines to an input layer of a trained deep learning network to acquire the first MRI image from an output layer of the learning network.

A method for training the above deep learning network may comprise: acquiring third data on third phase encoding lines obtained by undersampling along the first direction, with respect to a first image acquisition layer using the MRI device; acquiring fourth data on fourth phase encoding lines obtained by undersampling along the second direction, with respect to the first image acquisition layer using the MRI device; acquiring fifth phase encoding lines consisting of phase encoding lines obtained by full-sampling, with respect to the first image acquisition layer using the MRI device; generating an output layer-MRI image for training by applying a Fourier transform to the fifth phase encoding lines; and providing the third data and the fourth data to the input layer of the deep learning network and providing the output layer-MRI image for training to the output layer of the deep learning network to train the deep learning network.

The above generating of the first MRI image may comprise: generating a third k-space based on the first phase encoding lines and the second phase encoding lines; generating an input layer-MRI image by performing an FFT on the third k-space; and acquiring the first MRI image from an output layer of the deep learning network by providing the input layer-MRI image to an input layer of a trained deep learning network.

According to another aspect of the present invention, a method for training the deep learning network can be provided which comprises: acquiring third phase encoding lines obtained by undersampling along the first direction, with respect to a first image acquisition layer using the MRI device; acquiring fourth phase encoding lines obtained by undersampling along the second direction, with respect to the first image acquisition layer using the MRI device; generating a fourth k-space based on the third phase encoding lines and the fourth phase encoding lines; generating an input layer-MRI image for training by performing an FFT on the fourth k-space; acquiring fifth phase encoding lines obtained by full-sampling, with respect to the first image acquisition layer using the MRI device; generating an output layer-MRI image for training using the fifth phase encoding lines; and providing the input layer-MRI image for training to the input layer of the deep learning network and providing the output layer-MRI image for training to the output layer of the deep learning network to train the deep learning network.

According to still another aspect of the present invention, an MRI computing device may be provided which comprises: a processing unit; and a storage unit, wherein the processing unit is configured to perform: acquiring first phase encoding lines obtained by undersampling along a first direction using an MRI device; acquiring second phase encoding lines obtained by undersampling in a second direction different from the first direction using the MRI device; generating a first MRI image based on the first phase encoding lines and the second phase encoding lines; and generating a second MRI image different from the first MRI image based on the first phase encoding lines and the second phase encoding lines.

According to still another aspect of the present invention, a computer readable non-transitory recording device can be provided on which a program is recorded, wherein the program allows an MRI computing device to perform: acquiring first phase encoding lines obtained by undersampling along a first direction using an MRI device; acquiring second phase encoding lines obtained by undersampling in a second direction different from the first direction using the MRI device; generating a first MRI image based on the first phase encoding lines and the second phase encoding lines; and generating a second MRI image different from the first MRI image based on the first phase encoding lines and the second phase encoding lines.

Using the sampling strategy provided by the present invention, complementary effects can be obtained in both random and central sampling patterns.

The sampling strategy provided by the present invention, which is different in PE direction, can improve multi-acquisition MRI by incorporating anatomical information of other images undersampled in different PE directions.

The strategy proposed by the present invention can be applied to CNN and CS algorithms using central or random sampling patterns.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 1A, 1B and 1C illustrate a sampling strategy for multiple acquisition MRI;

FIGS. 2A, 2B, 2C, 2D and 2E are flowcharts illustrating an MRI image generation method according to an embodiment of the present invention;

FIG. 10 is a table showing evaluation scores according to a multiple contrast MRI reconstruction to which a sampling strategy according to the present invention is applied;

FIG. 12 shows an evaluation table in which multiple PC-bSSFPs are performed using the sampling strategy proposed in the present invention; and FIG. 13 shows an evaluation table when the sampling strategy proposed in the present invention is applied to multiple PC-bSSFPs.

DETAILED DESCRIPTION

Hereinafter, embodiments of the present invention will be described with reference to the accompanying drawings. However, the present invention is not limited to the embodiments described herein, but may be implemented in various other forms. The terminology used herein is for the purpose of understanding the embodiments and is not intended to limit the scope of the present invention. In addition, the singular forms used below include plural forms unless the phrases expressly have the opposite meaning.

Hereinafter, an MRI image generation method that may be provided according to an embodiment of the present invention will be described.

FIGS. 2A to 2E are flowcharts illustrating an MRI image generation method according to an embodiment of the present invention.

FIG. 3 is k-space images presented to help understanding the flowcharts shown in FIGS. 2A to 2E. FIG. 3(a) conceptually shows the area of the k-space to be completed. The horizontal axis of the k-space may be referred to as the kx axis, and the vertical axis may be referred to as the ky axis.

FIG. 4 shows a configuration example of a computing device (=MRI computing device) and an MRI device to which the present invention is applicable.

Figure 4A:
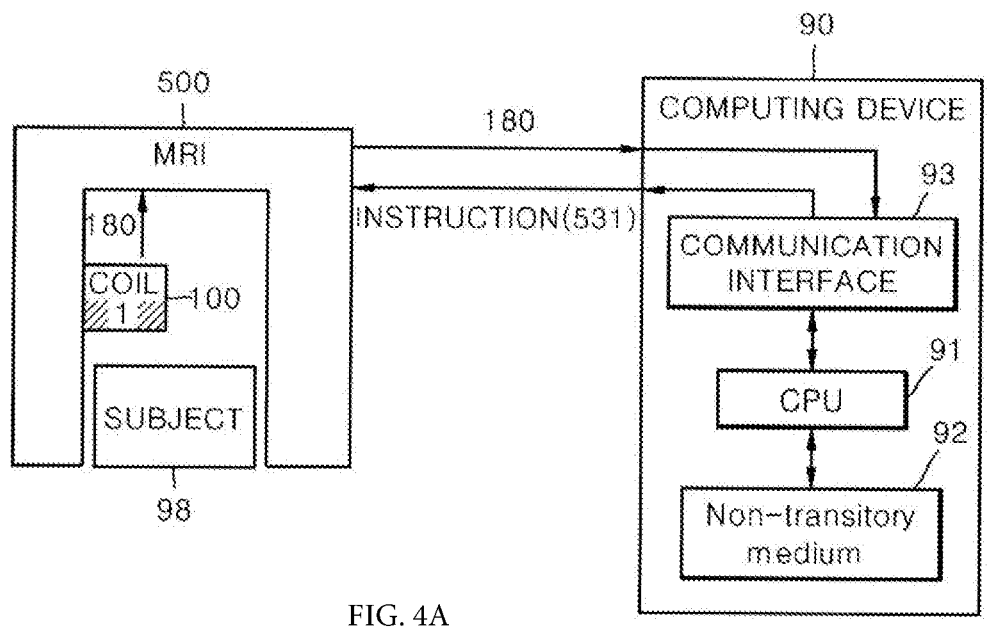
FIGS. 4A and 4B show a configuration example of a computing device and an MRI device to which the present invention is applicable.
Figure 4B:
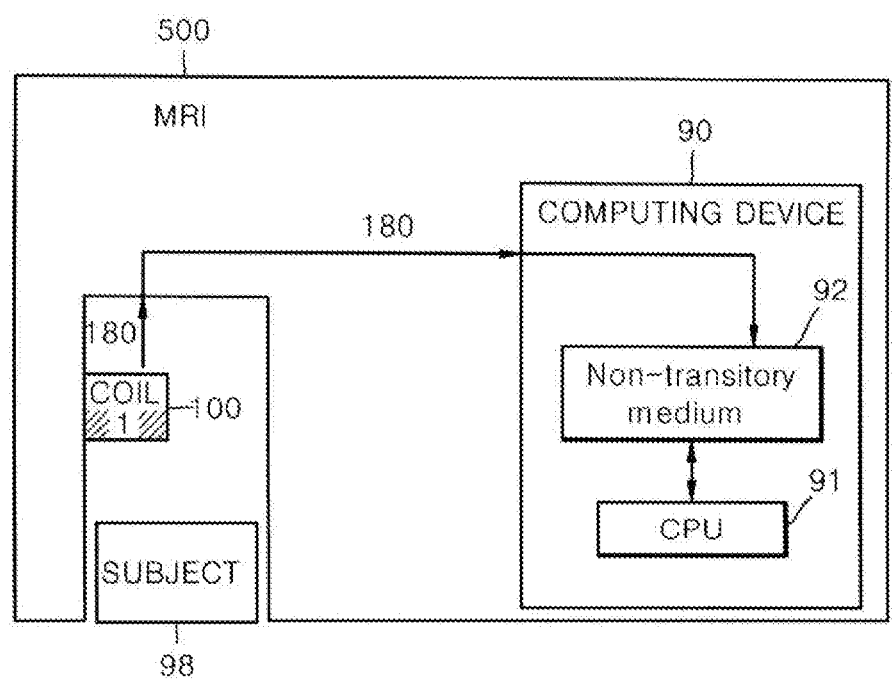

The computing device 90 may be provided separately from the MRI device 500 (FIG. 4(a)), or the computing device 90 may be provided as an integral part of the MRI device 500 (FIG. 4(b)).

Hereinafter, this will be described with reference to FIGS. 2A to 2E and 4.

As shown in FIG. 2A, the MRI image generation method according to an embodiment of the present invention may include the following steps S10 and S30.

Figure 1A:
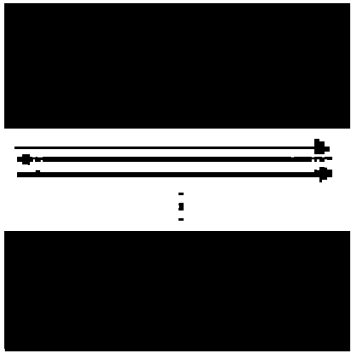

In step S10, the MRI device 500 is used to acquire first data on a first phase encoding line set consisting of phase encoding lines 110 stacked along a first direction (e.g., ky), respectively. At this time, the first phase encoding line set may occupy only a part of the k-space region 100. Each of the first phase encoding lines 110 may be expressed in a form extending along a second direction (e.g., kx) different from the first direction within the k-space shown in FIG. 1.

In step S20, the MRI device 500 is used to acquire second data on a second phase encoded line set consisting of phase encoded lines 120 stacked along the second direction (e.g., kx) respectively. At this time, the second phase encoding line set may occupy only a part of the k-space region 100. Each of the first phase encoding lines 120 may be expressed in a form extending along the first direction (e.g., ky) different from the second direction within the k-space shown in FIG. 2.

At this time, in the present invention, the second direction may be a direction different from the first direction.

In step S30, an MRI image may be generated using the first data and the second data.

As shown in FIG. 2B, in an embodiment of the present invention, the step S30 may include the following steps S310 and S320.

In step S310, the data of the k-space 130 may be determined using the first data and the second data. At this time, although the first phase encoding line set and the second phase encoding line set are provided, the data of a part of the k-space area 100 to be determined may still not be provided. In this case, the part of the data may be filled with the value generated by the computing device 90 according to a predetermined rule, rather than data measured through an MRI scan.

Alternatively, the data of the remaining region excluding the first phase encoding line set of the k-space may be determined using the second data.

In step S320, an MRI image may be generated from the determined k-space 130. Specifically, the MRI image may be obtained by performing the FFT on the completed k-space 130.

Figure 2C:
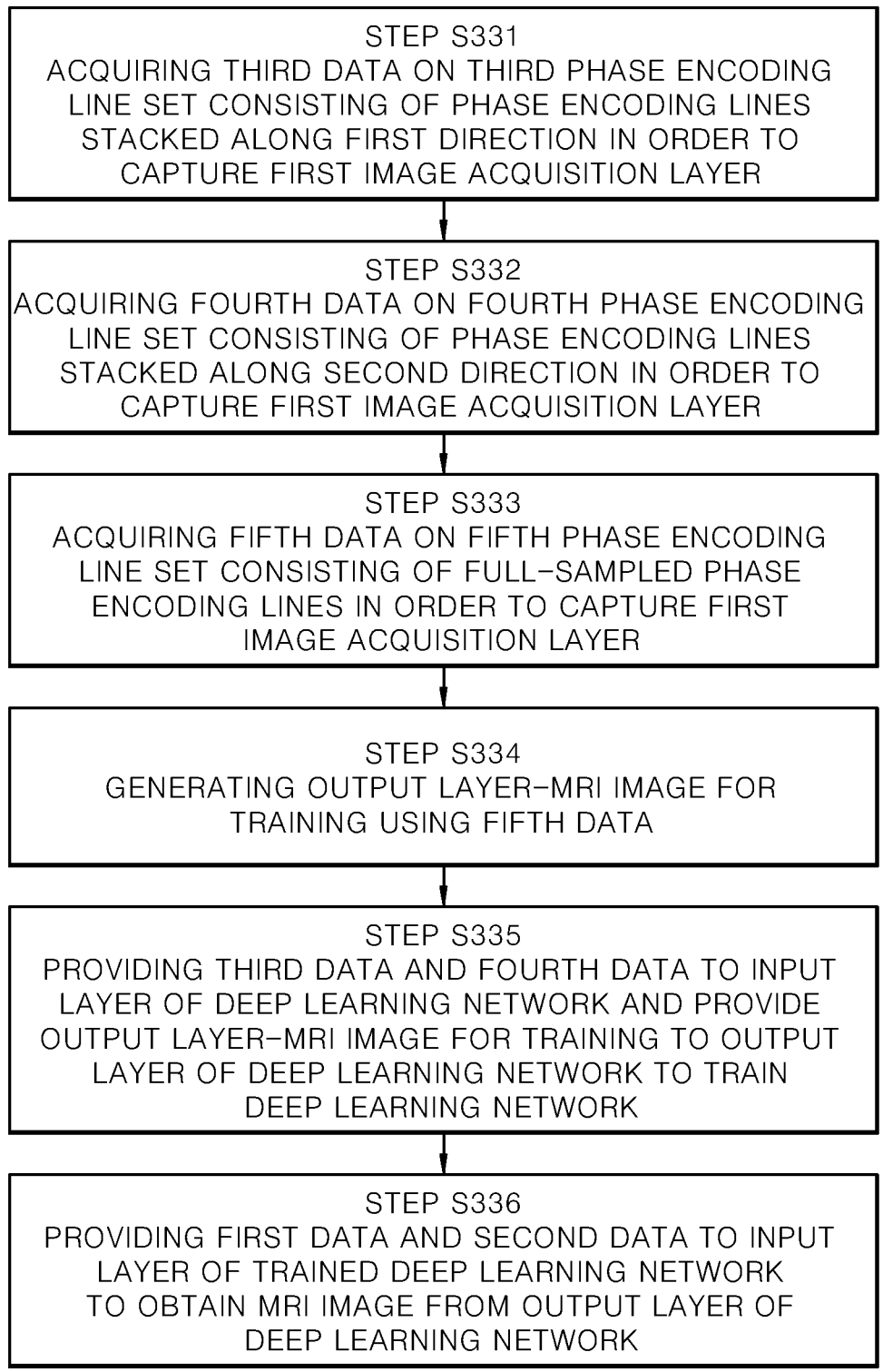

As shown in FIG. 2C, in another embodiment of the present invention, the step S30 may be performed using deep learning. In FIG. 2C, step S30 may be performed including steps S331 to S336.

Figure 2D:
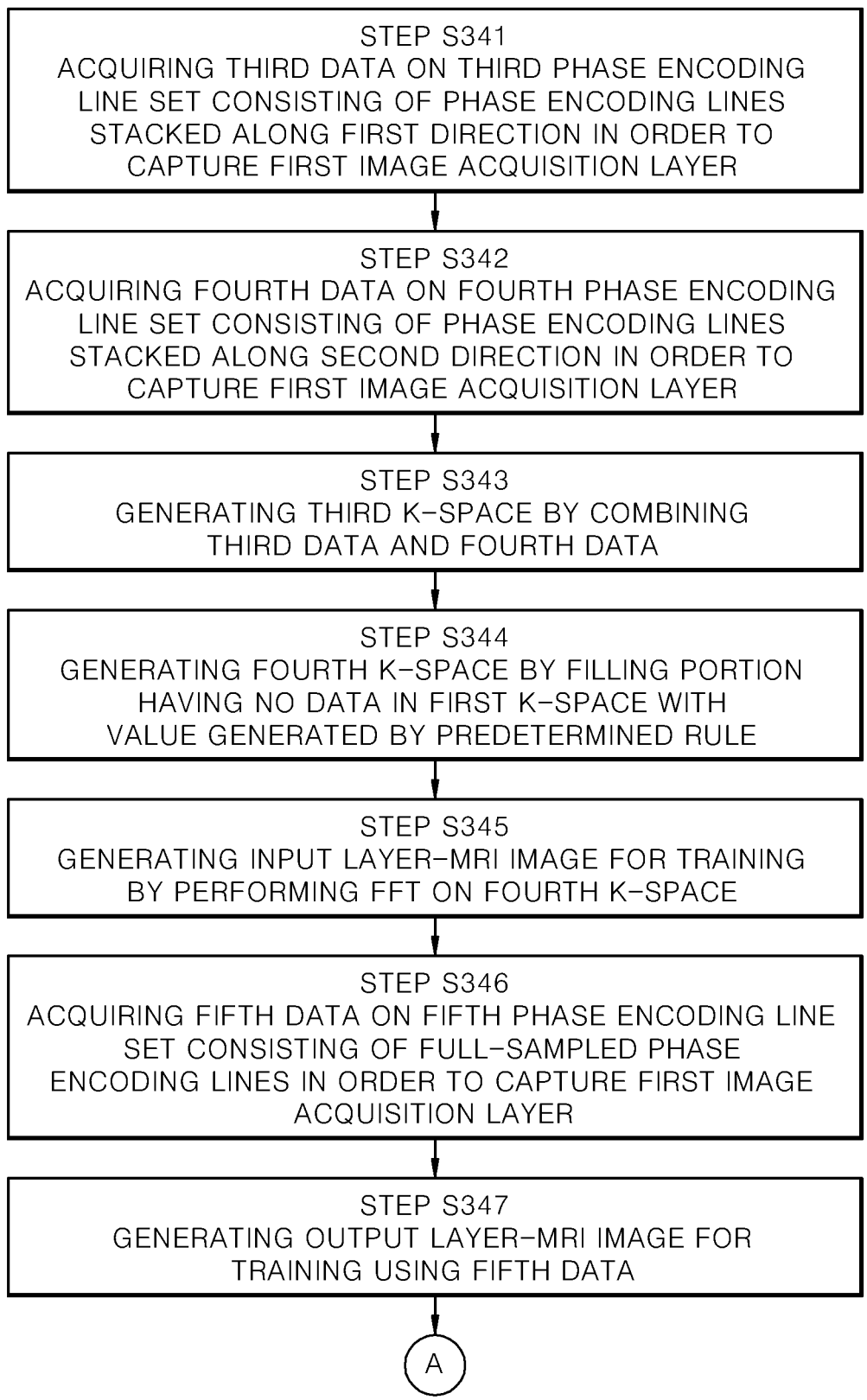
Figure 2E:
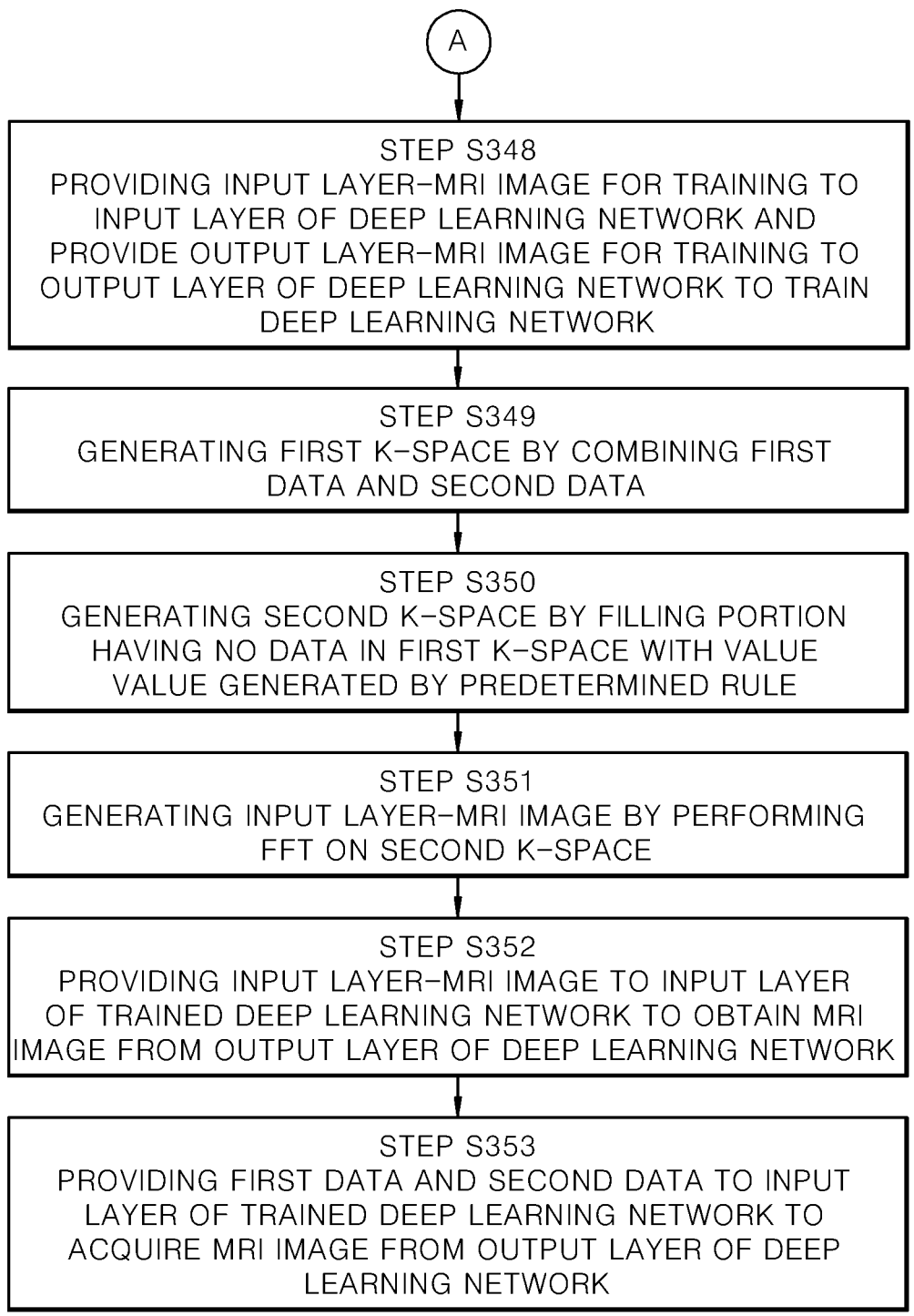
Figure 3A:
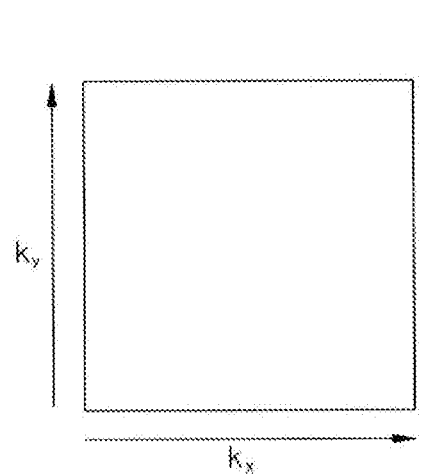
FIGS. 3A, 3B, 3C and 3D are k-space images presented to help understanding the flowcharts shown in FIGS. 2A to 2E.
Figure 3B:
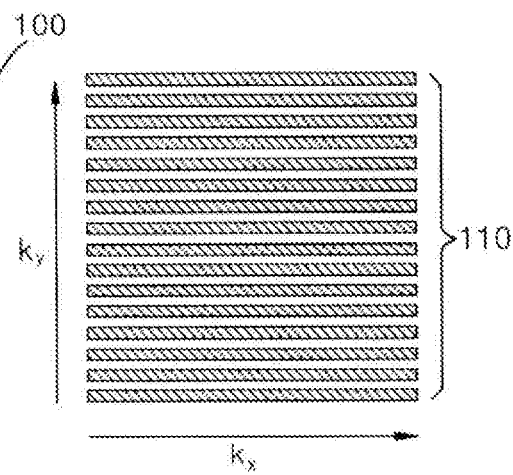
Figure 3C:
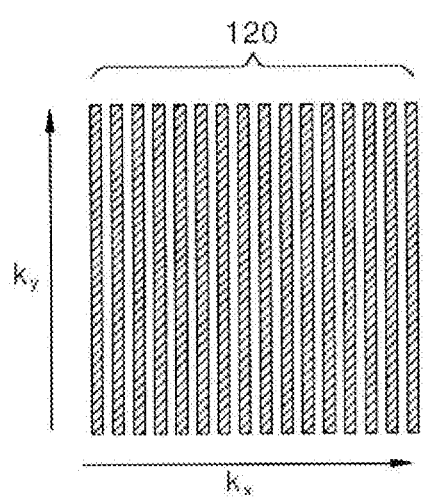
Figure 3D:
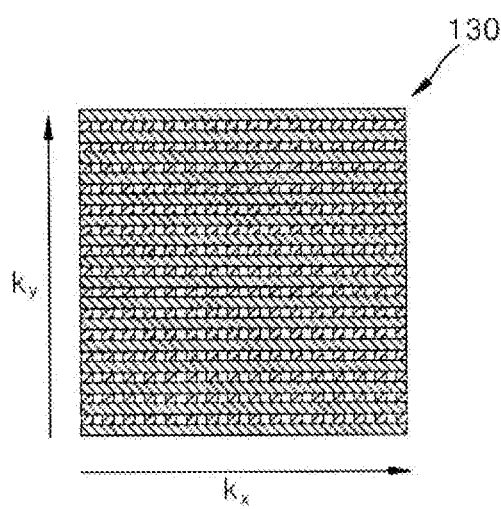

As shown in FIG. 2D and FIG. 2E, in another embodiment of the present invention, the step S30 may be performed using another deep learning. In FIG. 2D and FIG. 2E, step S30 may be performed including steps S341 to S353.

When using deep learning, according to the above-described process, by using the training through a database, the k-space completed by filling the empty portions of the undersampled k-space is created to perform FFT, so that the MRI image may be acquired, and in addition, a training process through the database is modified differently from the training process so that it is also possible to create the desired MRI image directly without completing the undersampled k-space.

Without completing the k-space, i.e., without acquiring all the data needed to complete the k-space, previous studies on a method for creating MRI images after acquiring only some k-space data mainly use CS-MRI and deep learning.

Pages 75 to 77 of IEEE SIGNAL PROCESSING MAGAZINE, MARCH 2008 Compressed Sensing MRI articles disclose methods using CS-MRI. This method describes a method for generating an image without completing the k-space using the CS method. For example, the data acquisition method especially shown in FIG. 6(a) of page 78 of the Compressed Sensing MRI article represents a method similar to the random of FIG. 1A.

On the other hand, the IEEE 2017 "DEEP RESIDUAL LEARNING FOR COMPRESSED SENSING MRI" paper describes a method using deep learning instead of CS as a method for completing an image with incomplete k-space data In the deep learning method, after the uncompleted part is filled with zero, if the uncompleted k-space creates an image in the input layer, an image that contains severe aliasing artifacts is created, and this is putted to the input layer. Then, if the method puts the image of the completed k-space in the output layer and trains the deep learning model, this model trains the ability to convert an image of an uncompleted k-space into an image from a completed k-space.

In one embodiment of the present invention, a technique of generating an image using the uncompleted k-space through the deep learning may be provided. The database for deep learning is composed of a pair of input layer data and output layer data (=ground truth). First data for a first phase encoding line set composed of phase encoding lines stacked along a first direction and a second data for a second phase encoding line set composed of phase encoding lines stacked along a second direction are combined to create an incomplete k-space, and an image created by filling a portion having no data in the incomplete k-space with 0, for example, and then performing an FFT may be used as the input layer data. Then, a ground truth image generated by FFT of the completed k-space may be provided as output layer data.

The deep learning algorithm used in one embodiment of the present invention may use a structure called a convolutional neural network. The data of the input layer is passed through the convolution filter having the structure of stacked layers, and finally the data is generated in the output layer. The values of the convolution filter are determined to minimize the difference between the data generated here and the ground truth data of the database during the training course of the deep learning. In one embodiment of the invention using deep learning, the first data and the second data are provided to an input layer of a training deep training network so that the MRI image is acquired from an output layer of the deep learning network. At this time, the method for training the deep learning network includes acquiring third data on a third phase encoding line set composed of phase encoding lines stacked along the first direction in order to photograph the first image acquisition layer using the MRI device, acquiring fourth data on a fourth phase encoding line set composed of phase encoding lines stacked along a second direction in order to photograph the first image acquisition layer using the MRI device, acquiring fifth data on a fifth phase encoding line set composed of full-sampled phase encoding lines in order to photograph the first image acquisition layer using the MRI device, generating an output layer-MRI image for training using the fifth data, and providing the third data and the fourth data to the input layer of the deep learning network and providing the output layer-MRI image of the training to the output layer of the deep learning network to train the deep learning network. At this time, the third phase encoding line set and the fourth phase encoding line set may be undersampled.

The term 'full-sampling' refers to a method for acquiring all information on all acquisition phase-encoding lines so as to acquire all the data of the k-space to be completed, and is in contrast to the undersampling.

In another embodiment of the present invention utilizing deep learning, it may include combining the first data and the second data to generate a first k-space, generating a second k-space by filling the data-free portion of the first k-space with a value generated by a predetermined rule, generating an input layer-MRI image by performing an FFT on the second k-space, and acquiring the MRI image from the output layer of the deep learning network by providing the input layer-MRI image to the input layer of the trained deep learning network. At this time, the method for training the deep learning network includes acquiring third data on a third phase encoding line set composed of phase encoding lines stacked along the first direction in order to photograph the first image acquisition layer using the MRI device, acquiring fourth data on a fourth phase encoding line set composed of phase encoding lines stacked along a second direction in order to photograph the first image acquisition layer using the MRI device, combining the third data and the fourth data to generate a third k-space, generating a fourth k-space by filling the data-free portion of the first k-space with a value generated by a predetermined rule, generating an input layer-MRI image for training by performing an FFT on the fourth k-space, acquiring fifth data on a fifth phase encoding line set composed of full-sampled phase encoding lines to capture the first image acquisition layer using the MRI device, generating an output layer-MRI image for training using the fifth data, and providing the input layer-MRI image of the training layer to the input layer of the deep learning network and providing the output layer-MRI image of the training layer to the output layer of the deep learning network to train the deep learning network.

Each of the above-described steps S10 to S30 may be performed in the computing device 90 included in the MRI device 500 or in the computing device 90 that may be connected to the MRI device 500. The computing device 90 may include a processing unit 91, a storage unit 92, and a communication unit 93. Each of the above-described steps S10 to S30 may be performed in the processing unit 91 in particular.

As shown in FIG. 4(a), if the computing device 90 is provided separately from the MRI device 500, in each of the above steps, the signal 180 received from the first coil 100 may be transmitted from the MRI device 500 to the computing device 90 through the communication unit 93 and stored in the storage unit 92 and then, provided to the processing unit 91. The computing device 90 may provide the MRI device 500 with an instruction 531 to control the MRI device 500 or to request the MRI device 500.

As shown in FIG. 4(b), if the computing device 90 is included in the MRI device 500, in each of the above steps, the signal 180 received from the first coil 100 may be directly stored in the storage unit 92 from the MRI device 500 and then provided to the processing unit 91 again.

At this time, the first phase encoding line set may be undersampled for k-space. That is, when it is assumed that the k-space is divided into N encoded lines stacked along the first direction, the first phase encoding line set consists of M1 (M1<N) encoded lines stacked along the first direction. In addition, the second phase encoding line set may be undersampled for k-space. That is, when it is assumed that the k-space is divided into N encoded lines stacked along the second direction, the second phase encoding line set consists of M2 (M2<N) encoded lines stacked along the second direction.

At this time, the first phase encoding line set may be acquired using one of a central sampling pattern and a random sampling pattern. Then, the second phase encoding line set may be acquired using one of a central sampling pattern and a random sampling pattern. However, the sampling pattern that may be applied to the present invention is not limited to the above-described central sampling pattern and random sampling pattern, and other types of sampling patterns may be applied.

Embodiments of the central sampling pattern are described in the above-mentioned Korean Patent Application No. 10-2015-0119256, which is incorporated herein by reference. The random sampling pattern means a sampling pattern having an irregular pattern, instead of a predetermined rule such as a central sampling pattern, a pairing sampling pattern, a dAVE sampling pattern, and the like.

At this time, the first phase encoding line set and the second phase encoding line set may be acquired in different time periods. That is, the start of acquisition of the second phase encoding line set may be started after a time point at which the acquisition of the first phase encoding line set is completed.

According to another embodiment of the present invention, a method for determining k-space data may be provided. The method may include steps S10, S20, and S310 described above. At this time, the first phase encoding line set may be acquired using a sampling strategy of either a central sampling strategy or a random sampling strategy, and the second phase encoding line set may be acquired using a sampling strategy of either a central sampling strategy or a random sampling strategy. According to another embodiment of the present invention, an MRI computing device 90 including a processing unit 91 and a storage unit 92 may be provided. At this time, the processing unit 91 may be configured to execute steps S10, S20, and S30 described above.

According to another embodiment of the present invention, an MRI device 500 including the MRI computing device 90 described above may be provided. According to another embodiment of the present invention, a non-transitory recording device 92 (=storage unit) in which a computer-readable program is recorded may be provided. At this time, the program may cause the MRI computing device including the processing unit 91 to execute steps S10, S20, and S30 described above.

Experiment

The strategy proposed by the present invention was demonstrated in both CS and CNNs, which supports that our method can be generalized. The sampling strategy proposed by the present invention was tested in multi-contrast MRI and multiple PC-bSSFP imaging by using CS algorithms and CNNs.

The sampling strategy with different PE direction according to one embodiment of the present invention can improve multi-acquisition MRI by integrating anatomical information from other images undersampled along different PE direction. The strategy proposed by the present invention was applicable to CS algorithms and CNNs using central or random sampling patterns. It war confirmed the effects of the proposed strategy in multi-contrast MRI and multiple PC-MRI, which supports that the proposed sampling strategy may be used in various applications to acquire multiple images acquired along the same scan direction.

The routine MR protocol is generally composed of multiple scans for various contrasts. The process of repeated acquisition and reconstruction of multiple contrast images with the same scan direction can be accelerated by exchanging information between the images. The present invention propose the sampling strategy to efficiently accelerate such multi-acquisition MRI in a simple manner. The advantage of the sampling strategy proposed by the present invention with different PE direction was demonstrated in both multi-contrast MR imaging and multiple PC bSSFP imaging. It was also confirmed that the sampling strategy proposed by the present invention works well regardless of the reconstruction method (CNN, CS) or sampling pattern (central, random).

Hereinafter, the procedure of the experiment performed according to one embodiment of the present invention and the results thereof will be described.

Multi-Contrast MRI

The sampling strategy proposed according to the present invention was evaluated using public and in vivo multi-contrast MRI datasets. First, T2/PD images from the public IXI database were used. Total 577 datasets from healthy subjects were divided into 434 training sets and 143 test sets for CNNs. Images were resized to 192×192, and detailed imaging parameters were described in the website (http://brain-development.org/ixi-dataset/). Since the public data are magnitude images, pseudo k-spaces were generated by Fourier transform of the magnitude images.

Figure 1B:
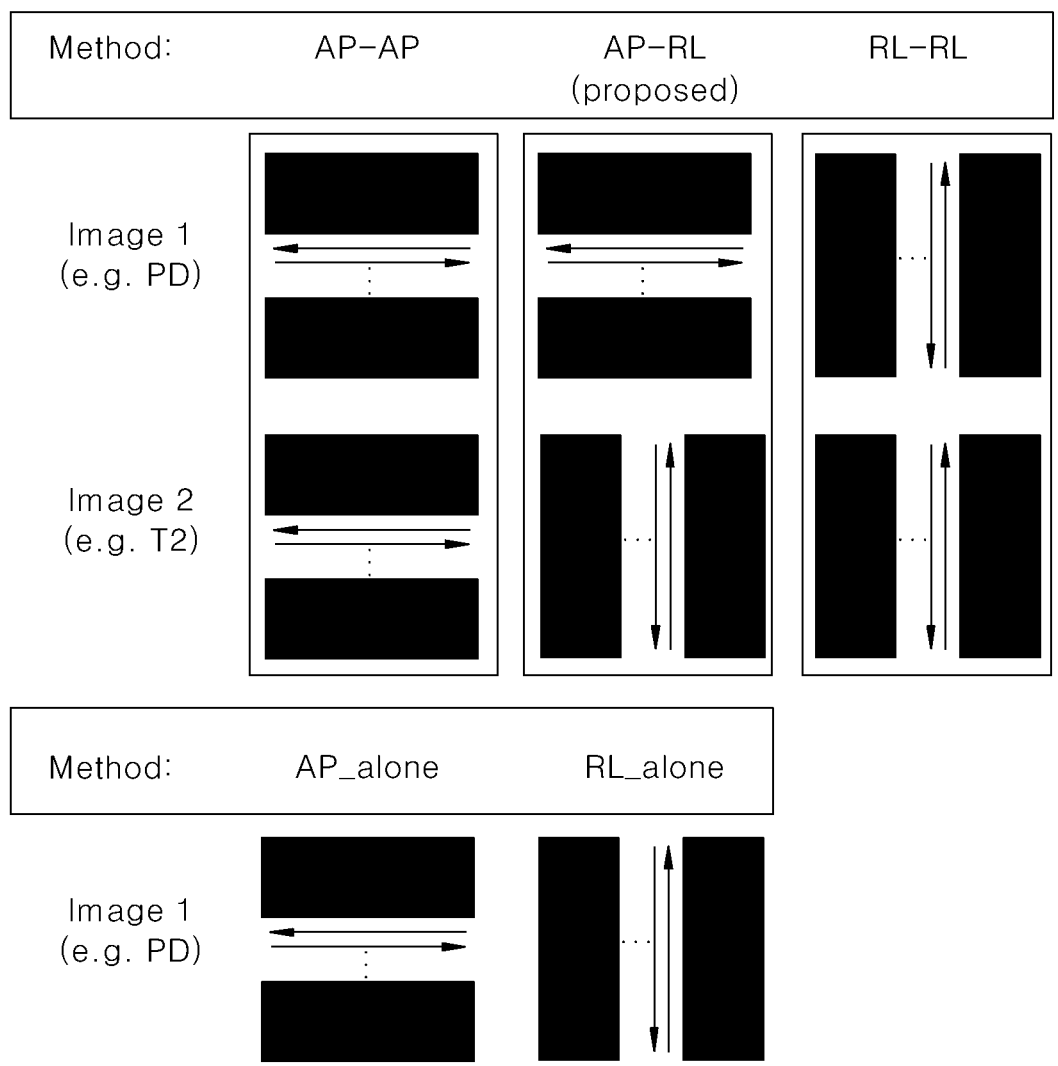

Then, as like shown in (a) of FIG. 1B, the pseudo k-spaces were 4-, 6-, and 8-fold undersampled using five combinations of central and random sampling patterns. CNNs received two undersampled images as input, and generated two reconstructed images as output with the input images acted as a reference to each other to improve reconstruction (AP-AP, AP-RL, and RL-RL in FIG. 1B).

In addition, as shown in (b) of FIG. 1B, to evaluate the effects of the reference image, we evaluated CNNs using only one undersampled image with no reference image (AP_alone and RL_alone in FIG. 1B). The training for 29,804 images from the 434 public datasets took approximately 15 hours.

Second, the sampling strategy proposed in the present invention was evaluated in in vivo brain MRI data from ten subjects. T1, T2, and PD images were acquired using Cartesian coordinate on a 3T MRI scanner (MAGNETOM Trio, Siemens Healthcare, Erlangen, Germany). Two datasets from the T1, T2, and PD datasets were chosen and applied to CNNs and CS algorithms from multi-contrast MRI. Since CNNs reconstructed only one image at a time, one CNN was trained using a total of six input combinations from the three datasets (T1, T2, and PD). Since the number of datasets was small, CNNs were pre-trained with the public data and fine-tuned with 4- and 8-fold undersampled datasets from the three subjects. Because of the insufficient data size, we randomly rotated the data between $-10°$ and $10°$ to quadruple the data. Axial double echo T2- and proton density (PD)-weighted images were obtained with the following parameters: repetition time=3700 ms; echo time=37/103 ms; field of view=220×165 mm; number of slices=15; slice thickness=5 mm; flip angle=150°; and matrix=320×240. Axial spin-echo T1-weighted images were acquired with the same parameters except for repetition time of 500 ms, echo time of 9.8 ms, and flip angle of 70°. The CS algorithms were tested on datasets from the remaining seven subjects. The k-space data from the four coil channels were compressed to one channel data by using a coil compression algorithm (31). The FMC-CS and BCS algorithms were also compared to CNNs that were trained using randomly undersampled images obtained from the coil-compressed k-spaces.

Multiple PC-bSSFP MRI

The sampling strategy proposed in the present invention was applied to reconstruction using CNNs in eight in vivo PC-bSSFP datasets from nine healthy subjects. All brain images were acquired using the 3T MRI scanner described above. All the in vivo experiments were performed with local institutional review board approval and informed consent was waived.

Banding-free bSSFP images were generated with the maximum intensity projection (MIP) of the eight PC-bSSFP datasets and used as ground truth. The four phase-cycled k-spaces were 4-fold undersampled using three sampling strategies composed of central and random sampling patterns (FIG. 2b), and their total scan time is the same as that of a single full-sample image. To train CNNs, these undersampled images were concatenated along third direction and used as input. Scan parameters are described, as follows:

repetition time=3700 ms; echo time=37/103 ms; field of view=220×165 mm; number of slices=15; slice thickness=5 mm; flip angle=150°; and matrix=320×240.

Reconstruction Methods

CNNs received two images and four images as input for the multi-contrast MRI and the four PC-bSSFP, respectively. Multiple images were concatenated along the third dimension and used as inputs for CNNs. CNNs were trained to generate one image as close to the ground truth as possible.

Figure 5:
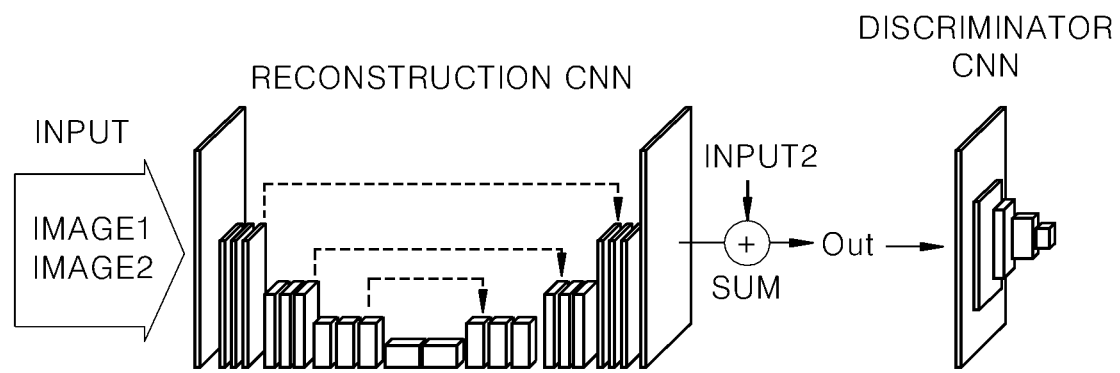
FIG. 5 is a diagram illustrating CNN.

FIG. 5 is a schematic illustration of a CNN. A reconstruction CNN receive multiple images as input(input1) and generates outputs(Out). Input1 is a concatenation of two images with different contrast in multi-contrast MRI and four phase cycled images in multiple PC-bSSFP. Input2 is the first image of the two images in multi-contrast MRI and maximum intensity projection of the four PC-bSSFP images. A discriminator is trained using the results of the reconstruction CNN in order to distinguish out from ground truth.

As shown in FIG. 5, the proposed CNN framework was composed of reconstruction CNN and discriminator CNN.

The reconstruction CNN was based on Unet, formed by 22 convolutional blocks and 4 skip connections. Each convolutional block was composed of a convolutional layer with a filter size of 4×4, a batch normalization, and a rectified linear unit (ReLU) layer. Last convolutional layer was added to the input for residual training. Skip connection and residual training enhanced the performance of CNNs with fast convergence speed. The reconstruction CNN was optimized by combination of L1 loss and the discriminator CNN. The discriminator enabled the reconstruction CNN to generate perceptually better image quality. The discriminator had three convolutional blocks with a stride of 2, in order to have a small receptive field. In the training stage, full-sampled images and undersampled images were used as ground truth and input, respectively. Experiments using CNNs were performed using Tensorflow on a single NVIDIA GTX 1080Ti graphic processor. The proposed method was trained by Adam optimizer 33 with a learning rate of 0.0002 and batch size of 4.

The proposed sampling strategy with the random sampling pattern was applied to the reconstruction of multi-contrast MRI using existing CS algorithms. We used Bayesian CS (BCS) and fast multi-contrast (FMC-CS). These CS algorithms reconstructed two undersampled images simultaneously. Random sampling pattern was generated using probability density function. BCS (maximum iteration of $1\times10^4$ and termination criterion of $1\times10^{-8}$) and FMC (iteration of 100) were optimized separately.

Preferred Embodiment

Hereinafter, preferred embodiments of the present invention will be described with reference to FIGS. 6 to 8.

Figure 6:
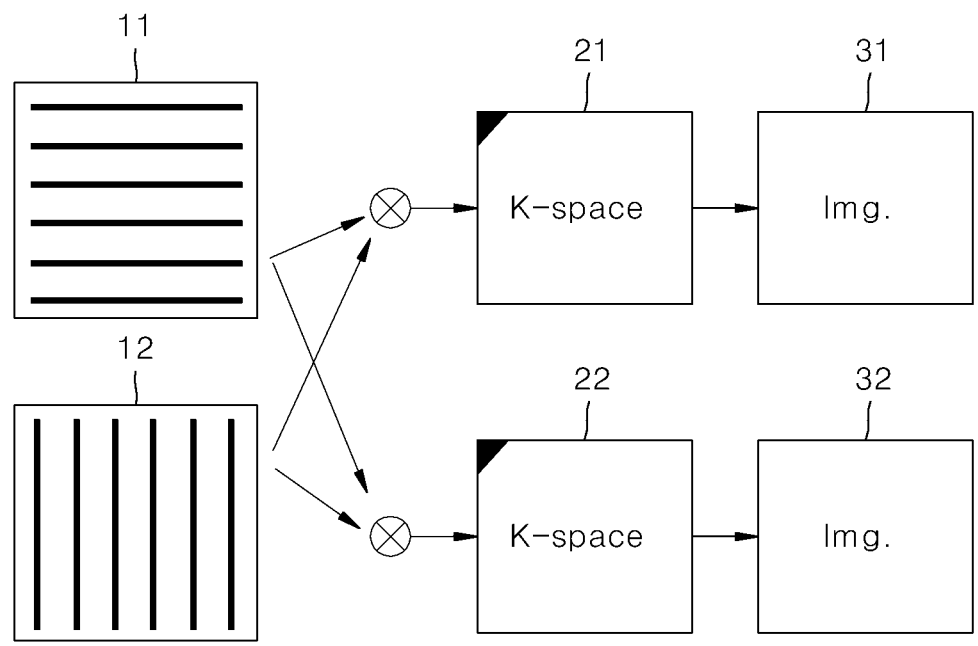
FIG. 6 is a diagram illustrating a method for generating an MRI image according to an embodiment of the present invention.

FIG. 6 is a diagram illustrating a method for generating an MRI image according to an embodiment of the present invention. This will be described below with reference to FIG. 6.

A method for generating an MRI image may include: acquiring first phase encoding lines 11 obtained by undersampling along a first direction using the MRI device 500; acquiring second phase encoding lines 12 obtained by undersampling along a second direction different from the first direction using the MRI device; generating a first MRI image 31 based on the first phase encoding lines 11 and the second phase encoding lines 12; and generating a second MRI image 32 different from the first MRI image 31 based on the first phase encoding lines 11 and the second phase encoding lines 12. At this time, the generating of the first MRI image 31 may include determining a first k-space 21 based on the first phase encoding lines 11 and the second phase encoding lines 12 and generating the first MRI image 31 from the first k-space 21 and the generating of the second MRI image 32 may include determining a second k-space 22 different from the first k-space 21 based on the first phase encoding lines 11 and the second phase encoding lines 12 and generating the second MRI image 23 from the second k-space 22.

At this time, preferably, the determining of the first k-space 21 includes filling the first phase encoding lines 11 with the k-space required to acquire a predetermined FOV and resolution and filling the remaining portion of the k-space with some or all of the second phase encoding lines 12, and the determining of the second k-space 22 includes filling the k-space with the first phase encoding lines 11 and filling the remaining portion of the k-space with some or all of the second phase encoding lines 12.

At this time, preferably, the first phase encoding lines 11 may be acquired using a sampling pattern of either a central sampling pattern or a random sampling pattern, and the second phase encoding lines 12 may be acquired using either a central sampling pattern or a random sampling pattern.

Hereinafter, a modified embodiment of the present invention will be described with reference to FIG. 7.

FIG. 7 is a diagram illustrating a method for generating an MRI image using a deep learning network according to an embodiment of the present invention.

Figure 7A:
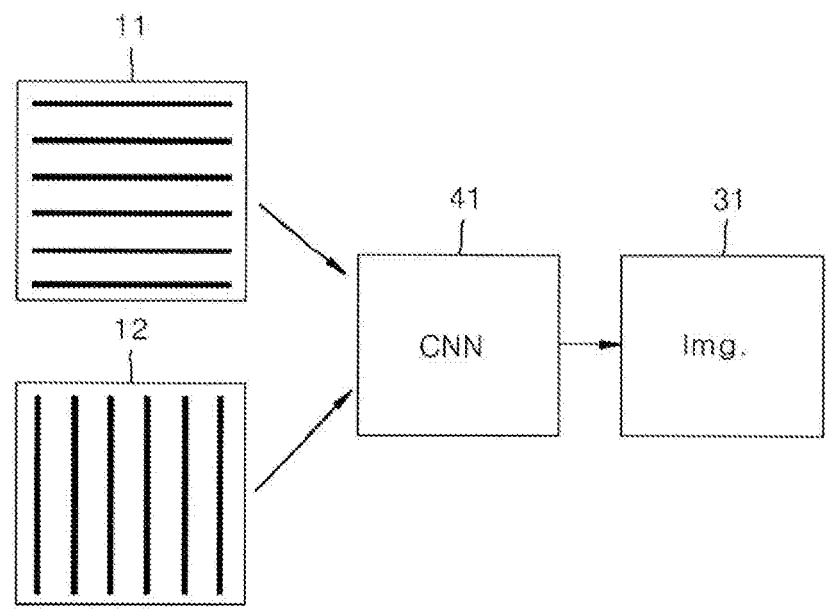
FIGS. 7A and 7B are diagrams illustrating a method for generating an MRI image using a deep learning network according to an embodiment of the present invention.

Hereinafter, referring to FIG. 7(a), the generating of the first MRI image 31 may include acquiring the first MRI image 31 from the output layer of the deep learning network 41 by providing first data on the first phase encoding lines 11 and second data on the second phase encoding lines 12 to the input layer of the trained deep learning network 41.

Figure 7B:
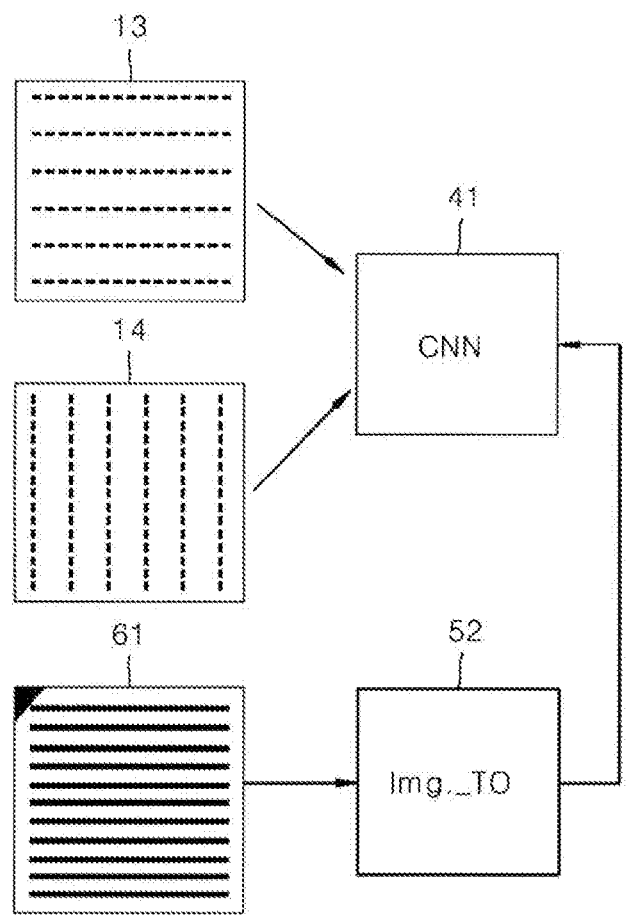

Hereinafter, a method for training the deep learning network 41 will be described with reference to FIG. 7(b). The method for training the deep learning network 41 includes: acquiring third data on third phase encoding lines 13 obtained by undersampling along the first direction, with respect to the first image acquisition layer using the MRI device; acquiring fourth data on fourth phase encoding lines 14 obtained by undersampling along the second direction, with respect to the first image acquisition layer using the MRI device; acquiring a fifth phase encoding line 61 consisting of phase encoding lines obtained by full-sampling, with respect to the first image acquisition layer using the MRI device; generating an output layer-MRI image 52 for training by applying a Fourier transform to the fifth phase encoding lines 61; and providing the third data and the fourth data to the input layer of the deep learning network 41 and providing the output layer-MRI image 52 for training to the output layer of the deep learning network 41 to train the network 41.

Hereinafter, another modified embodiment of the present invention will be described with reference to FIG. 8.

Figure 8A:
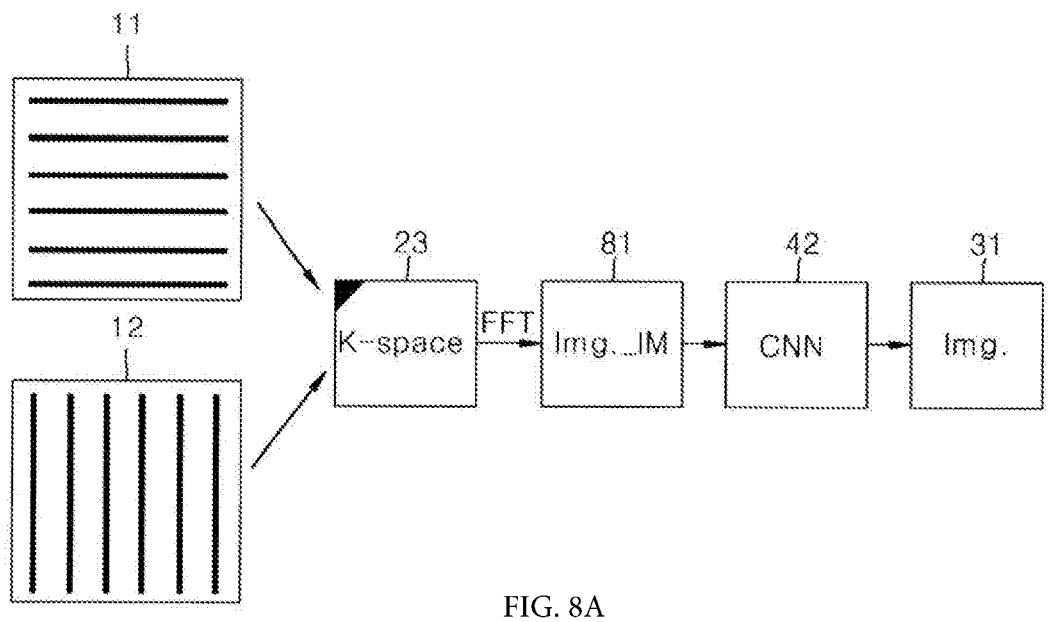
FIGS. 8A and 8B are diagrams illustrating a method for generating an MRI image using a deep learning network according to another embodiment of the present invention.
Figure 8B:
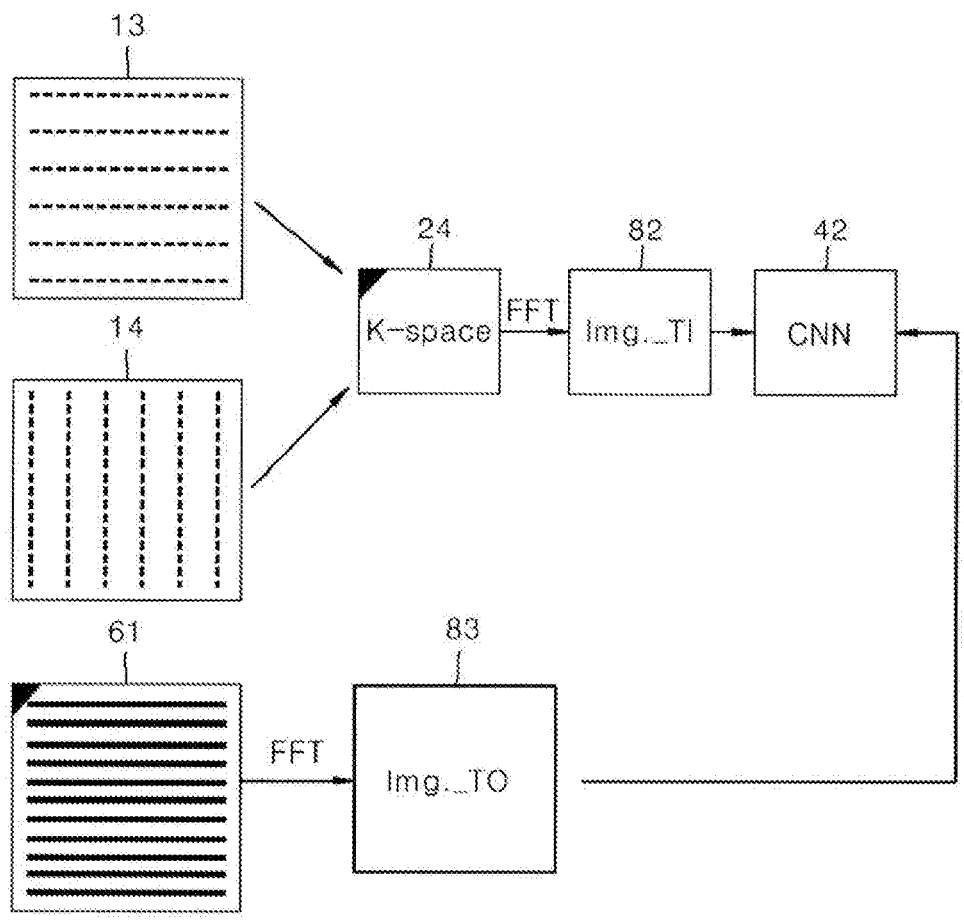

FIG. 8 is a diagram illustrating a method for generating an MRI image using a deep learning network according to another embodiment of the present invention.

Hereinafter, referring to FIG. 8(a), the generating of the first MRI image 31 includes: generating a third k-space 23 based on the first phase encoding lines 11 and the second phase encoding lines 12; generating an input layer-MRI image 81 by performing an FFT on the third k-space 23; and acquiring the first MRI image 31 from an output layer of the deep learning network 42 by providing the input layer-MRI image 81 to an input layer of a trained deep learning network 42.

Hereinafter, a method for training the deep learning network 42 will be described with reference to FIG. 8(*b*). The method for training the deep learning network 42 may include: acquiring third phase encoding lines 13 obtained by undersampling along the first direction, with respect to the first image acquisition layer using the MRI device; acquiring fourth phase encoding lines 14 obtained by undersampling along the second direction, with respect to the first image acquisition layer using the MRI device; generating a fourth k-space 24 based on the third phase encoding lines and the fourth phase encoding lines; generating an input layer-MRI image 82 for training by performing an FFT on the fourth k-space; acquiring fifth phase encoding lines 61 obtained by full-sampling, with respect to the first image acquisition layer using the MRI device; generating an output layer-MRI image 83 for training using the fifth phase encoding lines 61; and providing the input layer-MRI image 82 for training to the input layer of the deep learning network 42 and providing the output layer-MRI image 83 for training to the output layer of the deep learning network 42 to train the deep learning network 42.

The steps described in FIGS. 6 to 8 may be performed by the MRI computing device 90 including the processing unit 91 and the storage unit 92 shown in FIG. 4.

At this time, the storage unit 92 as a non-transaction recording device may be installed in the MRI computing device 90 and may be provided in various forms such as an SSD, an HDD, a portable memory card, and the like.

The non-transaction recording device provided according to an embodiment of the present invention may have a program recorded thereon for causing the MRI computing device to perform the steps described in FIGS. 6 to 8.

Data Analysis

The results according to the present invention were evaluated according to the sampling strategy, the reconstruction algorithms, and the sampling pattern. Differences between the outputs and the ground truths were evaluated with the metrics of structural similarity (SSIM) and normalized root mean square error (NRMSE), as described in the equation below.

$$NRMSE = \sqrt{\frac{\sum_{i=1}^{all}(GT_i - out_i)^2}{\sum_{i=1}^{all}(GT_i)^2}} \quad (1)$$

Where GT is the ground truth image and out is the output.

Multi-Contrast MRI

Figure 9A:
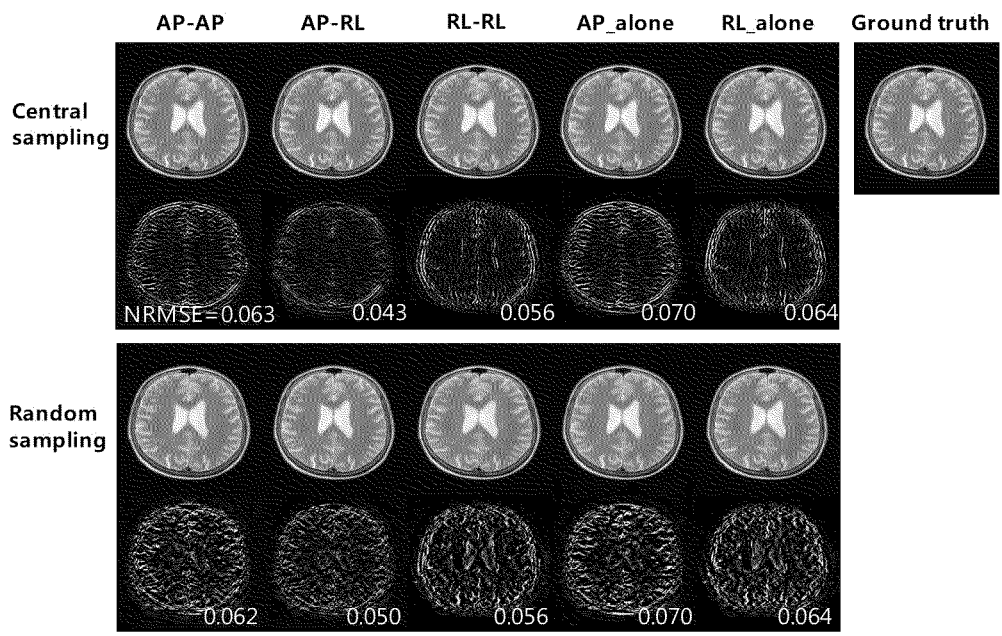
FIGS. 9A and 9B show examples of the results of CNN with various sampling strategies using the prior art and the technique according to the present invention.

The images (a) FIG. 9 shows the results of CNNs with various sampling strategy. Each sampling strategy was tested with central and random sampling patterns individually. The first to fifth columns of the first row of FIG. 9(*a*) represent images acquired using the central sampling pattern, and the first to fifth columns of the third row represent images acquired using the random sampling pattern. The numbers NRMSE given in the images shown in the second row and the fourth row of FIG. 9(*a*) indicate the error of the result according to each sampling strategy for the ground truth. When the strategy AP-RL proposed by the present invention is used, it may be seen that it represents the lowest error.

Figure 9B:
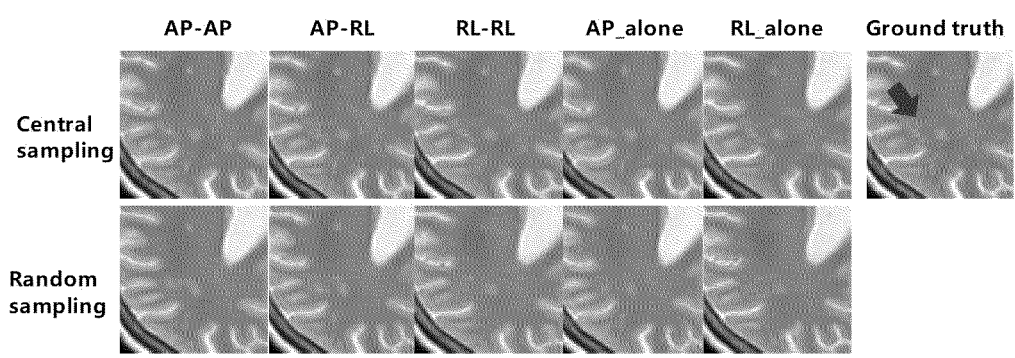

Each of the images shown in FIG. 9B is an enlarged view of a part of each corresponding image shown in FIG. 9B. The difference between the images is clear in the abnormal high signal intensities of the subcortical while matter(arrow).

The images shown in the second column of FIGS. 9(*a*) and 9(*b*) represent images obtained by acquiring data in different phase encoding directions according to an embodiment of the present invention.

FIG. 10 is a table showing evaluation scores according to a multiple contrast MRI reconstruction to which a sampling strategy AP-RL according to the present invention is applied.

Figure 11:
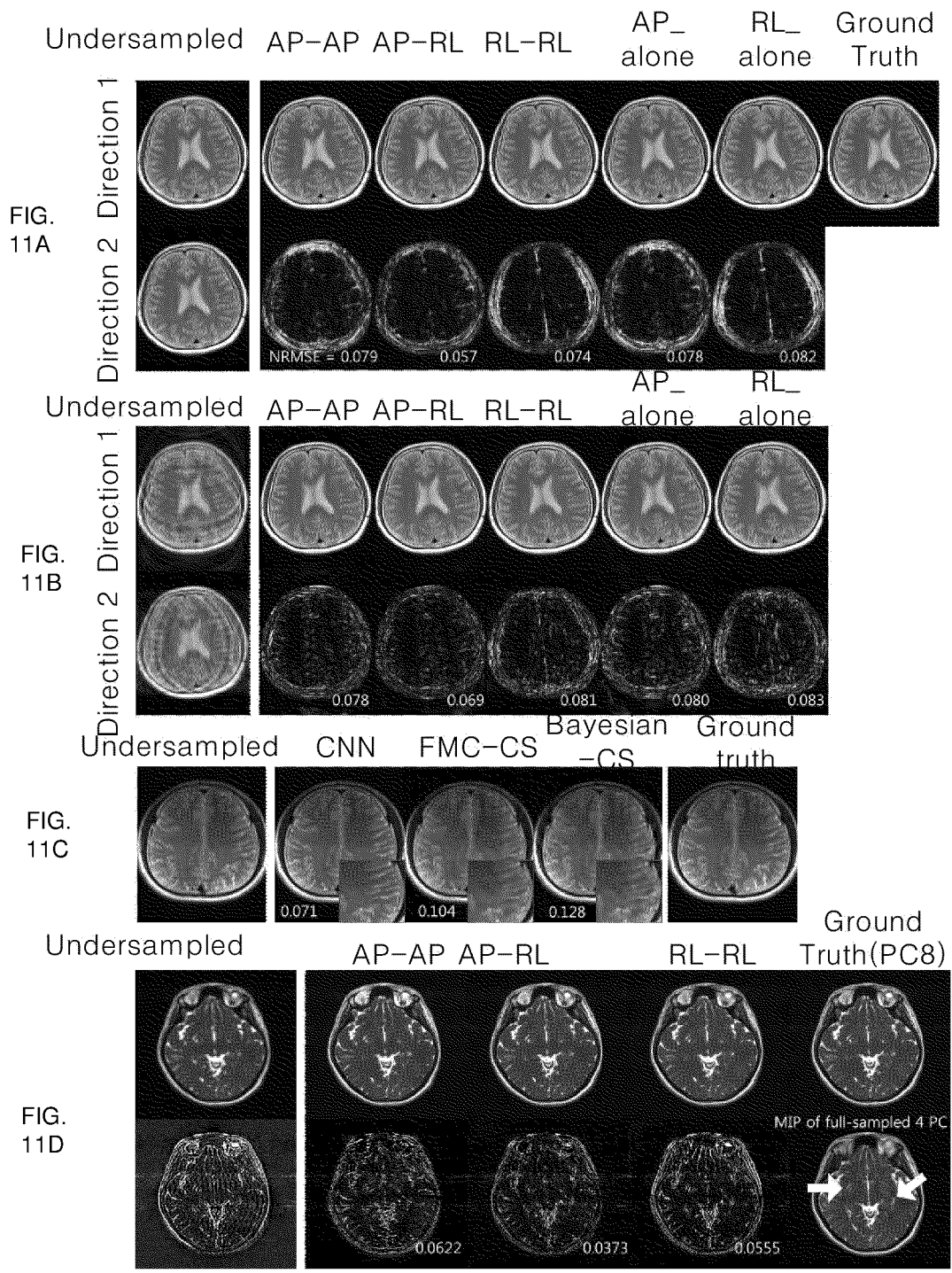
FIGS. 11A, 11B, 11C and 11D show examples of an MRI image with various sampling strategies using the prior art and the technique according to the present invention.

FIG. 11(*a*) shows examples of images acquired through an undersampling strategy using a central sampling pattern. The first column of the first row of FIG. 11(*a*) shows an image obtained by using an undersampling strategy using a phase encoding direction along the first direction, and the first column of the second row of FIG. 11(*a*) shows an image acquired using an undersampling strategy using a phase encoding direction along the second direction. The second to sixth columns of the first row of FIG. 11(*a*) represent images acquired using different sampling strategies, and the seventh column of the first row of FIG. 11(*a*) represents the ground truth image.

The numbers given in the images shown in the second to sixth columns of the second row of FIG. 11(*a*) represent the error between the result according to each corresponding sampling strategy and the ground truth.

FIG. 11(*b*) shows examples of images acquired through an undersampling strategy using a random sampling pattern. The first column of the first row of FIG. 11(*b*) shows an image obtained by using an undersampling strategy using a phase encoding direction along the first direction, and the first column of the second row of FIG. 11(*a*) shows an image acquired using an undersampling strategy using a phase encoding direction along the second direction.

The second to sixth columns of the first row of FIG. 11(*b*) represent images acquired using different sampling strategies.

The numbers given in the images shown in the second to sixth columns of the second row of FIG. 11(*b*) represent the error between the result according to each corresponding sampling strategy and the ground truth.

The first column of FIG. 11(*c*) shows the undersampled image using a random sampling pattern, and the second to fifth columns represent the CNN image, the FMC-CS image, the Bayesian-CS image, and the ground truth image, respectively. The first to fifth columns of the first row of FIG. 11(*d*) respectively indicate the undersampled image, the image according to the AP-AP sampling strategy, the image according to the AP-RL sampling strategy, the image according to the RL-RS, and the ground truth PCB image.

The numbers shown in the first to fourth columns of the second row of FIG. 11(*d*) represent the error between the corresponding image and the ground truth image. In the case of an image according to the AP-RL sampling strategy proposed in the present invention, it is shown that the error is the smallest.

FIG. 12 shows an evaluation table in which multiple PC-bSSFPs are performed using the sampling strategy proposed in the present invention.

In the public data, the proposed sampling strategy (AP-RL) according to the present invention showed the lowest NRMSE and the highest SSIM values, irrespective of the accelerating factor and the sampling pattern As shown in (a) of FIG. 9, results from a representative subject showed that the proposed strategy (AP-RL) provided images closest to the ground truth.

As shown in (b) of FIG. 9, in magnified view, pathologic high signal intensities of white matter were the most clearly detected in the proposed strategy (AP-RL).

In addition, the reconstruction performance was better in the central sampling than in the random sampling, quantitatively and qualitatively. As compared to the reconstruction using single image (AP_alone and RL_alone), multi-contrast reconstruction methods provided better performance.

As shown in the evaluation table of FIG. 10, the results of CNNs in in vivo data were consistent with those of the public data Again, as whon in (a) and (b) of FIG. 11, the proposed strategy (AP-RL) showed the lowest error.

On the other hand, the differences between multi-contrast MRI with the same PE direction (AP-AP and RL-RL) and single image reconstruction (1_alone and 2_alone) were not significant, indicating that the advantage of using images with two different contrasts decreases when they were undersampled along the same PE direction.

As shown in FIG. 12, the two CS algorithms using the strategy (AP-RL) proposed by the present invention has provided the lowest NRMSE values than those using other sampling strategies In the comparison between the two methods, CNNs showed better reconstruction performance than the CS algorithms, quantitatively and qualitatively, which is shown as (c) of FIG. 11. The reconstruction of the undersampled two images with different contrast took about 30 sec, 5 mins, and 60 ms in FMC-CS, BCS, and CNNs, respectively.

Multiple PC-bSSFP MRI

FIG. 13 shows an evaluation table when the sampling strategy proposed in the present invention is applied to multiple PC-bSSFPs. The sampling strategy (AP-RL) proposed by the present invention showed the best performance in quantitative assessments, irrespective of sampling pattern The figure (d) of FIG. 11 demonstrates that the proposed strategy reconstructed details of the cerebellum accurately, while the results of the same PE direction showed distortions in the details. Furthermore, CNNs with the proposed strategy suppressed banding artifacts better than the image from MIP of 4 full-sampled PC-bSSFP images.

Complementary effects may be acquired in both random and central sampling patterns using the sampling strategy provided by the present invention.

A different sampling strategy, provided by the present invention, may improve multiple acquisition MRI by incorporating anatomical information of other images undersampled in different PE directions.

The strategy proposed by the present invention may be applied to CN algorithms and CS algorithms using central or random sampling patterns.

It will be apparent to those skilled in the art that various modifications and variations may be made in the present invention without departing from the spirit or essential characteristics thereof. The contents of each claim may be combined with other claims without departing from the scope of the claims.

What is claimed is:

1. An MRI image generation method comprising:
   acquiring, with an MRI device comprising a first coil and a computing device, first phase encoding lines obtained by a first undersampling scheme along a first direction;
   acquiring, with the MRI device, second phase encoding lines obtained by a second undersampling scheme in a second direction different from the first direction;
   generating, with the computing device, a first MRI image based on the first phase encoding lines and the second phase encoding lines; and
   generating, with the computing device, a second MRI image different from the first MRI image based on the first phase encoding lines and the second phase encoding lines,
   wherein,
   the first undersampling scheme is a first data acquisition scheme that does not acquire a portion of the total K-space data that must be acquired to achieve a predetermined FOV and resolution of the first MRI image, and
   the second undersampling scheme is a second data acquisition scheme that does not acquire a portion of the total K-space data that must be acquired to achieve the predetermined FOV and resolution of the first MRI image.

2. The method of claim 1, wherein,
   the generating of the first MRI image comprises: determining a first k-space based on the first phase encoding lines and the second phase encoding lines, and generating the first MRI image from the first k-space, and
   the generating of the second MRI image comprises: determining a second k-space different from the first k-space based on the first phase encoding lines and the second phase encoding lines, and generating the second MRI image from the second k-space.

3. The method of claim of 2, wherein,
   the determining of the first k-space comprises filling the first phase encoding lines into a k-space required to obtain a predetermined FOV and resolution, and filling a portion or all of a remaining portion of the k-space using the second phase encoding lines, and
   the determining of the second k-space comprises filling the first phase encoding lines into the k-space and filling a portion or all of the remaining portion of the k-space using the second phase encoding lines.

4. The method of claim 1, wherein the first phase encoding lines are acquired using any one sampling pattern among a central sampling pattern and a random sampling pattern, wherein the second phase encoding lines are acquired using any one sampling pattern among a central sampling pattern and a random sampling pattern.

5. The method of claim 1, wherein the generating of the first MRI image comprises providing first data on the first phase encoding lines and second data on the second phase encoding lines to an input layer of a trained deep learning network to acquire the first MRI image from an output layer of the deep learning network.

6. The method of claim 5, wherein a method for training the deep learning network comprises:
   acquiring, with the MRI device, third data on third phase encoding lines obtained by undersampling along the first direction, with respect to a first image acquisition layer using the MRI device;
   acquiring, with the MRI device, fourth data on fourth phase encoding lines obtained by undersampling along the second direction, with respect to the first image acquisition layer using the MRI device;
   acquiring, with the MRI device, fifth phase encoding lines consisting of phase encoding lines obtained by fullsampling, with respect to the first image acquisition layer using the MRI device;

generating, with the computing device, an output layer MRI image for training by applying a Fourier transform to the fifth phase encoding lines; and providing, with the computing device, the third data and the fourth data to the input layer of the deep learning network and providing the output layer MRI image for training to the output layer of the deep learning network to train the deep learning network.

7. The method of claim 1, wherein the generating of the first MRI image comprises:

generating a third k-space based on the first phase encoding lines and the second phase encoding lines;

generating an input layer-MRI image by performing an FFT on the third k-space; and acquiring the first MRI image from the output layer of the deep learning network by providing the input layer-MRI image to the input layer of the trained deep learning network.

8. A method for training a deep learning network comprising:

acquiring, with an MRI device comprising a first coil and a computing device, third phase encoding lines obtained by undersampling along a first direction, with respect to a first image acquisition layer;

acquiring, with the MRI device, fourth phase encoding lines obtained by undersampling along a second direction different from the first direction, with respect to the first image acquisition layer;

generating with the computing device, a fourth k-space based on the third phase encoding lines and the fourth phase encoding lines;

generating, with the computing device, an input layer-MRI image for training by performing an FFT on the fourth k-space;

acquiring, with the MRI device, fifth phase encoding lines obtained by full-sampling, with respect to the first image acquisition layer;

generating, with the computing device, an output layer-MRI image for training using the fifth phase encoding lines; and providing, with the computing device, the input layer-MRI image for training to an input layer of the deep learning network and providing, with the computing device, the output layer-MRI image for training to an output layer of the deep learning network to train the deep learning network.

9. An MRI device comprising:

an MRI scanner comprising a first coil; and an MRI computing device comprising a processing unit and a storage unit, wherein the processing unit is configured to perform:

acquiring, with a MRI device, first phase encoding lines obtained by a first undersampling scheme along a first direction;

acquiring, with the MRI device, second phase encoding lines obtained by a second undersampling scheme in a second direction different from the first direction;

generating a first MRI image based on the first phase encoding lines and the second phase encoding lines; and generating a second MRI image different from the first MRI image based on the first phase encoding lines and the second phase encoding lines, wherein, the first undersampling scheme is a first data acquisition scheme that does not acquire a portion of the total K-space data that must be acquired to achieve a predetermined FOV and resolution of the first MRI image, and the second undersampling scheme is a second data acquisition scheme that does not acquire a portion of the total K-space data that must be acquired to achieve the predetermined FOV and resolution of the first MRI image.

* * * * *